US011910543B2

(12) United States Patent
Hillman et al.

(10) Patent No.: US 11,910,543 B2
(45) Date of Patent: Feb. 20, 2024

(54) SUPPORT CHASSIS FOR ELECTRONIC DISPLAY

(71) Applicant: Daktronics, Inc., Brookings, SD (US)

(72) Inventors: Matt Hillman, Brookings, SD (US); Jeff Haliburton, Brookings, SD (US); Lincoln Hahn, Brookings, SD (US); Matt Kurtenbach, Brookings, SD (US); Ivan Vargas, Brookings, SD (US); Jason Young, Brookings, SD (US); Joshua Roiger, Brookings, SD (US)

(73) Assignee: Daktronics, Inc., Brookings, SD (US)

( * ) Notice: Subject to any disclaimer, the term of this patent is extended or adjusted under 35 U.S.C. 154(b) by 0 days.

(21) Appl. No.: 17/453,776

(22) Filed: Nov. 5, 2021

(65) Prior Publication Data

US 2022/0151087 A1    May 12, 2022

Related U.S. Application Data

(60) Provisional application No. 63/110,847, filed on Nov. 6, 2020.

(51) Int. Cl.
*H05K 5/00* (2006.01)

(52) U.S. Cl.
CPC .......... *H05K 5/0021* (2013.01); *H05K 5/0017* (2013.01)

(58) Field of Classification Search
CPC .......................... H05K 5/0017; H05K 5/0217
(Continued)

(56) References Cited

U.S. PATENT DOCUMENTS

| 2009/0021127 | A1* | 1/2009 | Miller | ............... G09F 9/3026 |
| | | | | 312/223.5 |
| 2011/0019348 | A1* | 1/2011 | Kludt | ............... H05K 5/06 |
| | | | | 361/679.01 |
| 2012/0236509 | A1 | 9/2012 | Cope et al. | |

FOREIGN PATENT DOCUMENTS

| CN | 101308277 | * | 7/2008 | .......... G02F 1/1333 |
| CN | 101499227 | | 8/2009 | |

(Continued)

OTHER PUBLICATIONS

"International Application Serial No. PCT/US2021/072269, International Preliminary Report on Patentability dated May 19, 2023", 9 pgs.

(Continued)

*Primary Examiner* — Hung S. Bui
(74) *Attorney, Agent, or Firm* — Schwegman Lundberg & Woessner, P.A.

(57) ABSTRACT

An electronic display comprises a support system comprising a plurality of support chassis, each support chassis comprising a plurality of chassis components each formed from one or more pieces of sheet metal, wherein the plurality of chassis components are welded together with a plurality of laser weld joints to form the support chassis having a front wall with a planar or substantially planar front mounting face, and a plurality of planar or substantially planar side walls, wherein the planar or substantially planar mounting faces of the plurality of support chassis are aligned to collectively form a front mounting surface, and a plurality of display modules mounted to the front mounting face, wherein each display module comprises an array of light-emitting element pixels, wherein the plurality of display modules collectively form a display surface.

14 Claims, 12 Drawing Sheets

(58) Field of Classification Search
USPC .......................................................... 361/731
See application file for complete search history.

(56) References Cited

FOREIGN PATENT DOCUMENTS

| | | |
|---|---|---|
| CN | 101739907 | 6/2010 |
| CN | 102647873 | 11/2014 |
| CN | 205194244 | 4/2016 |
| KR | 20050027375 | 3/2005 |
| WO | WO-2022099304 A1 | 5/2022 |

OTHER PUBLICATIONS

"International Application Serial No. PCT US2021 072269, International Search Report dated Mar. 3, 2022", 6 pgs.
"International Application Serial No. PCT US2021 072269, Written Opinion dated Mar. 3, 2022", 7 pgs.
"Australian Application Serial No. 2021373937, First Examination Report dated Nov. 14, 2023", 3 pgs.

* cited by examiner

SUPPORT CHASSIS FOR ELECTRONIC DISPLAY

CROSS-REFERENCE TO RELATED APPLICATIONS

This application claims the benefit of priority to U.S. Provisional Patent Application Ser. No. 63/110,847 entitled "SUPPORT CHASSIS FOR ELECTRONIC DISPLAY," filed Nov. 6, 2020, the disclosure of which is incorporated by reference herein in its entirety.

BACKGROUND

Displays comprising a plurality of light-emitting elements are used for the display of information. In some applications, such as digital billboards or scoreboards, individual display modules can be operated collectively to form a larger display. In such an arrangement, the individual display modules can be mounted onto the face or faces of one or more underlying support structures, which often referred to as "support chassis," "display chassis," or simply "chassis."

SUMMARY

In an example, the present disclosure describes a support chassis for an electronic display wherein one or more components that make up the support chassis are formed from shaped pieces of sheet metal that are joined together with a laser welding method of joining the sheet metal pieces.

BRIEF DESCRIPTION OF THE DRAWINGS

The drawings illustrate generally, by way of example, but not by way of limitation, various embodiments discussed in the present document.

DETAILED DESCRIPTION

Figure 1:
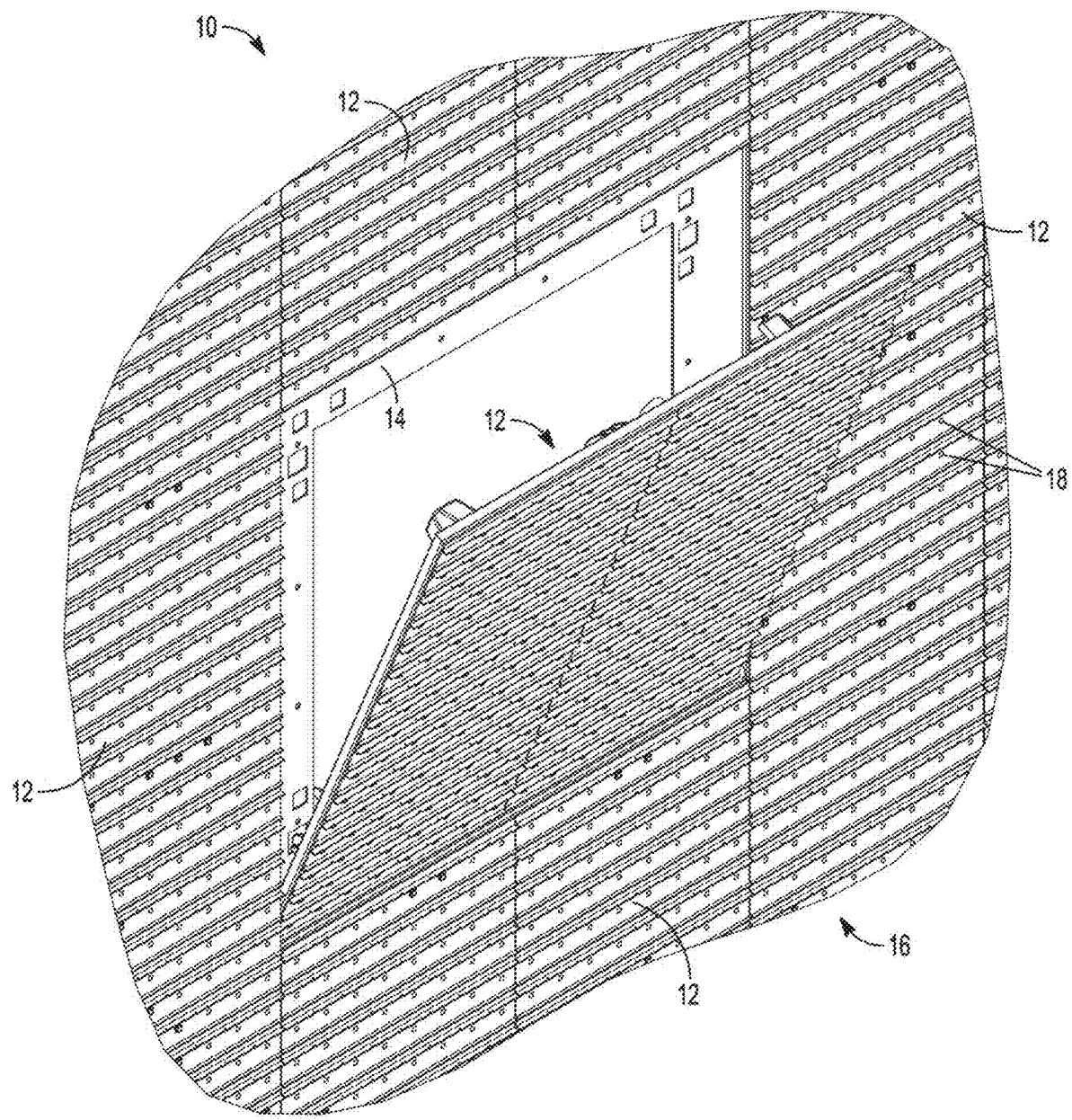
FIG. 1 is a partial perspective view of an example electronic display comprising a plurality of individual display modules that are operated in a cooperative manner to display information on the light-emitting display.

The following detailed description includes references to the accompanying drawings, which form a part of the detailed description. The drawings show, by way of illustration, specific embodiments in which the invention may be practiced. These embodiments, which are also referred to herein as "examples," are described in enough detail to enable those skilled in the art to practice the invention. The example embodiments may be combined, other embodiments may be utilized, or structural, and logical changes may be made without departing from the scope of the present invention. While the disclosed subject matter will be described in conjunction with the enumerated claims, it will be understood that the exemplified subject matter is not intended to limit the claims to the disclosed subject matter. The following detailed description is, therefore, not to be taken in a limiting sense, and the scope of the present invention is defined by the appended claims and their equivalents.

References in the specification to "one embodiment", "an embodiment," "an example embodiment," etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a concentration range of "about 0.1% to about 5%" should be interpreted to include not only the explicitly recited concentration of about 0.1 wt. % to about 5 wt. %, but also the individual concentrations (e.g., 1%, 2%, 3%, and 4%) and the sub-ranges (e.g., 0.1% to 0.5%, 1.1% to 2.2%, and 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. Unless indicated otherwise, the statement "at least one of" when referring to a listed group is used to mean one or any combination of two or more of the members of the group. For example, the statement "at least one of A, B, and C" can have the same meaning as "A; B; C; A and B; A and C; B and C; or A, B, and C," or the statement "at least one of D, E, F, and G" can have the same meaning as "D; E; F; G; D and E; D and F; D and G; E and F; E and G; F and G; D, E, and F; D, E, and G; D, F, and G; E, F, and G; or D, E, F, and G." A comma can be used as a delimiter or digit group separator to the left or right of a decimal mark; for example, "0.000,1" is equivalent to "0.0001."

In the methods described herein, the steps can be carried out in any order without departing from the principles of the invention, except when a temporal or operational sequence is explicitly recited. Furthermore, specified steps can be carried out concurrently unless explicit language recites that they be carried out separately. For example, a recited act of doing X and a recited act of doing Y can be conducted simultaneously within a single operation, and the resulting process will fall within the literal scope of the process. Recitation in a claim to the effect that first a step is performed, and then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first, step E is carried out last, and steps B, C, and D can be carried out in any sequence between steps A and E (including with one or more steps being performed concurrent with step A or Step E), and that the sequence still falls within the literal scope of the claimed process. A given step or sub-set of steps can also be repeated.

Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

The term "about" as used herein can allow for a degree of variability in a value or range, for example, within 10%, within 5%, within 1%, within 0.5%, within 0.1%, within 0.05%, within 0.01%, within 0.005%, or within 0.001% of a stated value or of a stated limit of a range and includes the exact stated value or range.

The term "direction" used herein can refer to, unless otherwise specified, to a linear direction for the purposes of describing or characterizing a physical location of a particular structure, for example to describe the physical location of one structure relative to another structure. In some specific examples, the term "direction" is used to refer to one or more reference directions for the purposes of describing or characterizing relative positioning of one structure relative to another. For example, a common set of reference directions that are well known to those of skill in the art are the directions used to describe three-dimensional Euclidean space, and in particular the directions associated with each axis of a three-dimensional Cartesian coordinate system. As will be appreciated by those having skill in the art, Cartesian coordinates are often used to define positions within a three-dimensional space by defining three imaginary reference axes, typically named the "x-axis," the "y-axis," and the "z-axis," which are pairwise perpendicular. These axes can also be used to define a "direction" associated with each axis, referred to herein as an "x-direction" defined as a linear direction that is parallel to the x-axis (but not necessarily coincident with the x-axis), a "y-direction" defined as a linear direction that is parallel to the y-axis (but not necessarily coincident with the y-axis), and a "z-direction" defined as a linear direction that is parallel to the z-axis (but not necessarily coincident with the z-axis).

The term "substantially" as used herein refers to a majority of, or mostly, such as at least about 50%, 60%, 70%, 80%, 90%, 95%, 96%, 97%, 98%, 99%, 99.5%, 99.9%, 99.99%, or at least about 99.999% or more, or 100%.

In addition, it is to be understood that the phraseology or terminology employed herein, and not otherwise defined, is for the purpose of description only and not of limitation. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

In the methods described herein, the acts can be carried out in any order without departing from the principles of the disclosed method, except when a temporal or operational sequence is explicitly recited. Furthermore, specified acts can be carried out concurrently unless explicit language recites that they be carried out separately. For example, a recited act of doing X and a recited act of doing Y can be conducted simultaneously within a single operation, and the resulting process will fall within the literal scope of the process. Recitation in a claim to the effect that first a step is performed, then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first and steps B, C, D, and E can be carried out in any sequence between steps A and E, and that the sequence still falls within the literal scope of the claimed process. A given step or sub-set of steps may also be repeated.

Electronic Display

FIG. 1 shows an example of an electronic information display 10 (also referred to as "the electronic display 10" or simply "the display 10") that is configured to display one or more of video, graphical, or textual information. The display 10 includes one or more individual display modules 12 mounted to one or more supports, such as one or more support chassis 14 (also referred to herein simply as "chassis 14" for brevity). In an example, one or both of each display module 12 or the chassis 14 includes a mounting structure or apparatus at one or more locations relative each display module 12, such as one or more fasteners or latches.

In examples wherein the display 10 is formed from a plurality of the display modules 12, the plurality of display modules 12 can be operated together so that the overall display 10 appears as a single, larger display. FIG. 1 shows one of the display modules 12 being in a pivoted or tilted position relative to the chassis 14, which can occur when that display module 12 is in the process of being mounted to, or dismounted from, the chassis 14. However, the display 10 of the present disclosure is not limited to a setup where the display modules 12 are pivoted or tilted during installation onto or removal from the chassis 14. In some examples, each display module 12 can be placed onto the chassis 14 (during installation) or pulled off of the chassis 14 (during removal) in a "straight on" orientation, e.g., with the plane of the display module 12 being parallel or substantially parallel with the plane of the chassis 14 during at least the last portion of display module position during installation and during at least the first portion of display module removal during uninstallation. The other display modules 12 in the display 10 of FIG. 1 have already been mounted to the chassis 14.

The display 10 can include a display surface 16 configured to display the video, graphical, or textual information from the display 10. As will be appreciated by those having skill in the art, the overall display surface 16 of the display 16 is formed from the front faces of the plurality of display modules 12. A plurality of light-emitting elements 18 is mounted to the display surface 16. For example, light-emitting elements can be mounted to one or more module support structures on each of the display modules 12, such as one or more of a circuit board, potting, or a module frame of a corresponding display module 12. The light-emitting elements 18 are operated together to display the video, graphical, or textual information on the display 10.

The light-emitting elements 18 can be any type of light-emitting technology known or yet to be discovered for the emission of light from a small area (e.g., from a pixel area), particularly for light-emitting technology that is or can be used display of visual information, such as video, graphical, or textual information. At the time of filing of the present application, light-emitting diodes (LEDs) are one of the most common light-emitting technologies in use for video or graphical displays of the type described herein. As such, for the sake of brevity, the remainder of the present disclosure will refer to light-emitting elements that can be used in a display (including the light-emitting elements 18 shown in FIGS. 1 and 2) will be referred to as LEDs 18. Those of skill in the art will appreciate, however, that any time the present disclosure uses the term "light-emitting diode" or "LED," that light-emitting devices other than LEDs can be used, including, but not limited to, liquid crystal display devices (LCDs), organic light-emitting diodes (OLEDs), organic light-emitting transistors (OLETs), surface-conduction electron-emitter display devices (SEDs), field-emission display devices (FEDs), laser TV quantum dot liquid crystal display devices (QD-LCDs), quantum dot light-emitting diode display devices (OD-LEDs), ferro-liquid display devices (FLDs), and thick-film dielectric electroluminescent devices (TDELs).

Figure 2:
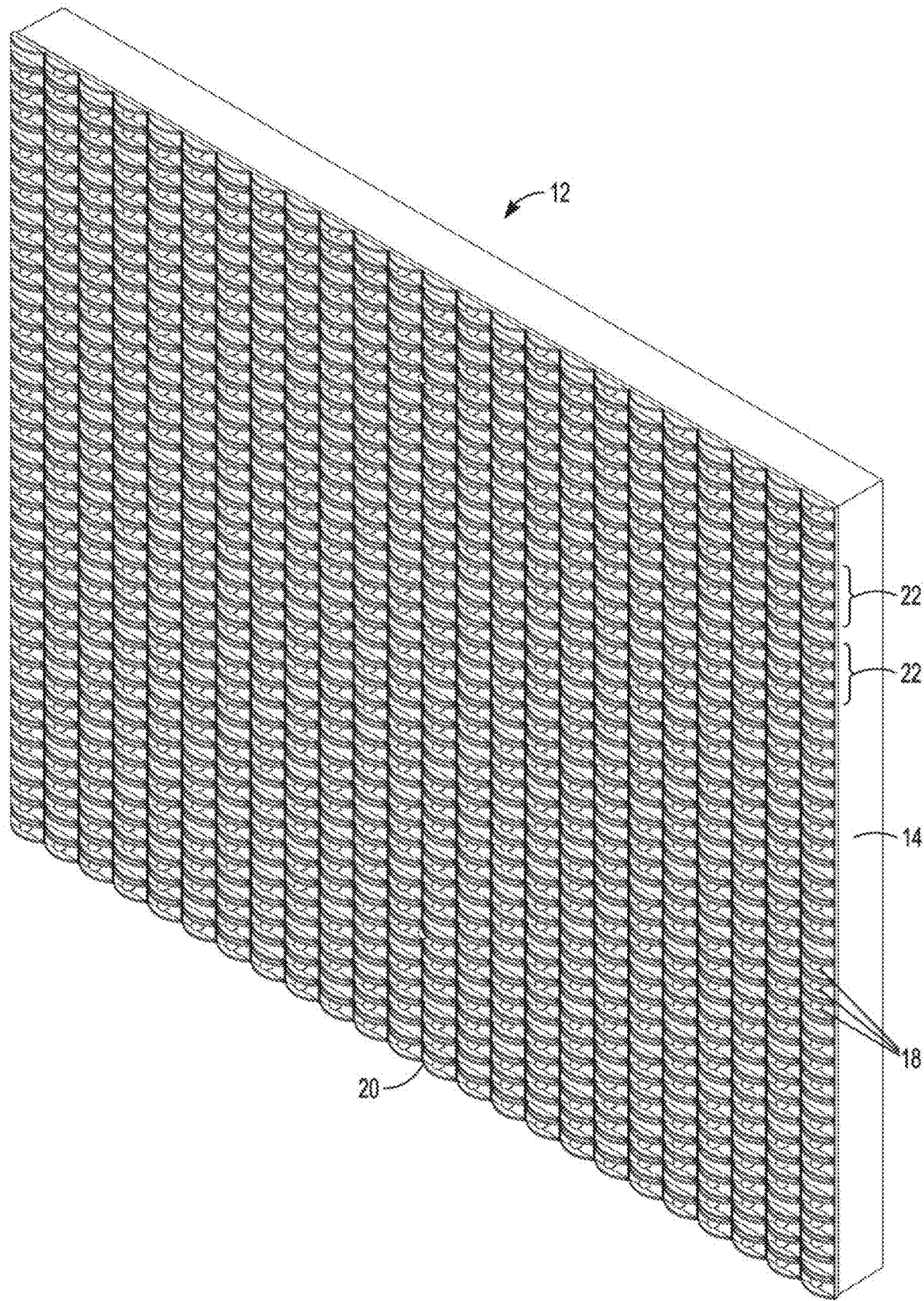
FIG. 2 is a perspective view of an example display module, which can be used as one of the individual display modules in the example electronic display of FIG. 1.

FIG. 2 is a perspective view of an example display module 12 that can be used in the display 10 of FIG. 1. The display module 12 includes a front face 20 configured to provide for a display of video, graphical, or textual content. A plurality of the LEDs 18 is mounted to the front face 20 by being mounted onto a module support structure, such as an electronics circuit board or a module frame. The LEDs 18 can be operated in such a way that the display module 12 will display a portion of the video, graphical, or textual information to be shown on the display 10. The front face 20 of the display module 12 is aligned and oriented relative to front faces 20 of one or more adjacently-positioned display modules 12 so that the front faces 20 of all the display modules 12 combine and cooperatively form the overall display surface 16 of the full display 10 (shown in FIG. 1). The plurality of display modules 12 are operated together in such a way as to display the video, graphical, or textual information in a cohesive manner so that the entire display 10 appears to a viewer as a single display that is larger than the individual display modules 12.

Figure 3:
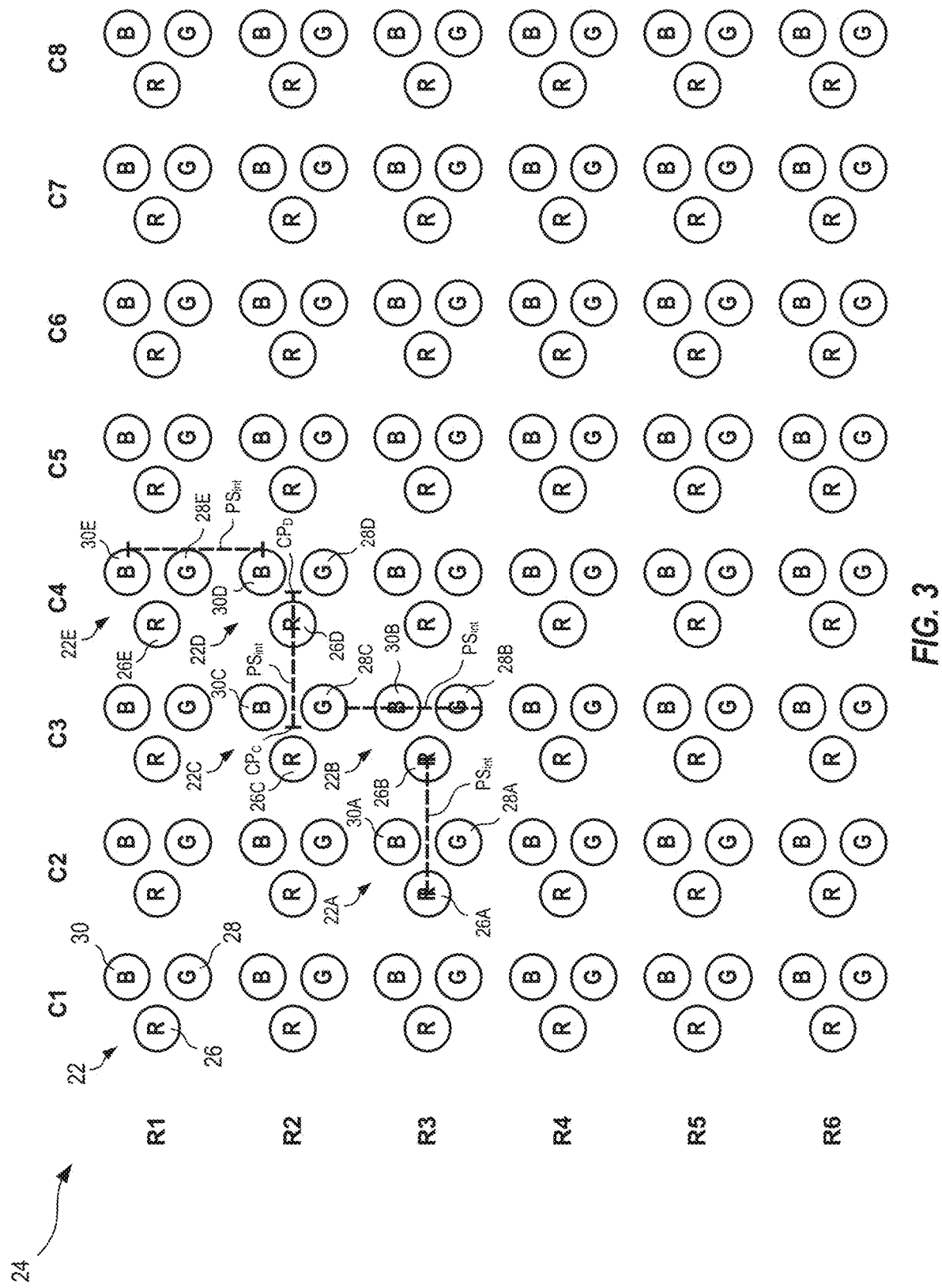
FIG. 3 is a front plane view of an example array of pixels, which could be the pixel array used for each display module in the example electronic display of FIGS. 1 and 2.

In an example, the LEDs 18 are arranged into an array 24 of pixels 22 (best seen in FIG. 3). Each pixel 22 includes one or more LEDs 18 grouped together in close proximity. The proximity of the pixels 22 allows the display 10 to be operated in such a way that they will appear to a viewer of the display 10 to form recognizable shapes, such as letters or numbers to display textual information or recognizable shapes to display video, graphical, or textual information. In some examples, the plurality of LEDs 18 includes a plurality of different-colored LEDs 18 such that different-colored LEDs 18 of each pixel 22 can be cooperatively operated to display what appears to be a spectrum of different colors for the viewer of the display 10. In an example, each pixel 22 includes three or more differently colored LEDs. A common combination of LEDs that is used to form a color electronic display is the so-called "RGB" configuration, with each pixel 22 including at least one red LED 26, at least one green LED 28, and at least one blue LED 30, as shown in the example configuration of FIG. 3. In the RGB configuration of the pixels 22, the red, green, and blue LEDs of each pixel 22 cooperate to provide essentially the entire color spectrum that is visible to humans based on whether one, two, or all three of the colors in a pixel 22 are lit, and at what intensities. The display 10 can also provide a black or empty looking surface over a portion of the display 10, when desired, by deactivating or turning off the LEDs in a designated area of pixels 22.

In some examples, the LEDs 18 of each pixel 22 can be arranged in a specified shape that is repeated for all of the pixels 22 in the array 24. In the example shown in FIG. 2, each pixel 22 includes a plurality of LEDs 18 arranged in a linear or substantially linear pixel shape comprising three LEDs 18 (e.g., which could be the red, green, and blue colored LEDs 18, as discussed above) that are aligned or substantially aligned in a common line, such as in the vertically aligned pixel shape of the pixels 22 shown in FIG. 2. Those of skill in the art will appreciate that pixel shapes other than a vertical or substantially vertical pixel 22 can be used, including, but not limited to: a linear or substantially linear pixel oriented in a direction other than vertical (e.g., a horizontal or substantially horizontal pixel shape or a diagonal linear pixel shape), or geometrical pixel shapes with one or more LEDs at each vertex of a specified geometrical shape. For example, as shown in the example array 24 of FIG. 3, the LEDs 26, 28, 30 can be arranged in triangular pixels 22, with each LED being positioned at the vertex of the triangle. Other pixel shapes can be contemplated, such as a quadrilateral pixel formed from four or more LEDs, a pentagonal pixel formed from five or more LEDs, and so on.

In an example, the pixels 22 are arranged in an array 24 with a specified pattern. For example, the pixels 22 can be arranged in a specified array, such as the example grid array 24 shown in FIG. 3. The display 10 can be controlled, for example with control software and/or one or more hardware controllers, so that visual information, e.g., video, graphical, or textual information, is broken down into coordinates. Each coordinate can correspond to a specific pixel location within the overall display 10, such as a specific row R and a specific column C, and the control software and/or the one or more hardware controllers can operate each pixel according to a program that specifies a condition for each coordinate within the display 10 and controls each of the pixels 22 so that it will appear to emit light that meets the condition specified. For example, if the display 10 is displaying a series of textual messages, the control software and/or the one or more hardware controllers can be fed the data corresponding to the series of textual messages, and the control software and/or the one or more hardware controllers can break the text of the messages down into conditions for each pixel 22, such as: the specified coordinates of the particular pixel 22; the time for the particular conditions of the particular pixel 22; whether the particular pixel 22 is to be lit at that time; the color that the particular pixel 22 is to display at that time (if the display 10 is a multi-colored display); and the intensity of the particular pixel 22 at that time. The control software and/or the one or more hardware controllers can also convert the information regarding color and intensity into specific operating parameters for each LED 26, 28, 30 in a particular pixel 22, such as the power that will be supplied to the red LED 26, the green LED 28, and the blue LED 30 in that pixel 22 and for how long in order to achieve the specified color and intensity at the specified time. The control software and/or the one or more hardware controllers can then send control signals to the pixels 22 or to individual LEDs 26, 28, 30 that can operate the pixels 22 according to the specified series of textual messages. Although a grid or grid-like array of LED pixels 22, as summarized above, is common, the display 10 described herein can use other arrangements of the LEDs or other systems for addressing the LEDs can be used without varying from the scope of the present invention.

As described above, in some examples, the pixels 22 of each display module 12 are arranged in a grid-like array 24. In such an example, the pixels 22 can be positioned on the display module 12 such that they have an internal pixel spacing. As used herein, the term "pixel spacing" refers to the distance between a reference pixel 22 and the pixel or pixels 22 that are nearest to that reference pixel 22. In examples where the pixels 22 are arranged in a grid with a specified number of pixel rows R and a specified number of pixel columns C, as in the example grid array 24 shown in FIG. 3, then the pixel spacing can refer to the distance between two adjacent pixels 22 in the same row R or two adjacent pixels 22 in the same column C.

The "internal pixel spacing," as used herein, refers to the pixel spacing between two adjacent pixels on the same display module 12. In an example, the internal pixel spacing between two adjacent pixels 22 is measured from a specified reference point within the pixel 22 (such as the geometric center of a specific one of the LEDs 18, or some other specified point of the specific LED 18, or the geometric center of the entire pixel 22) and the same reference point in the adjacent pixel 22. For example, if the example array 24 in FIG. 3 is assumed to be on the same display module 12, an internal pixel spacing $PS_{int}$ between a first reference pixel 22A located in the third row R3 and the second column C2 of the array 24 and a second pixel 22B in the same row R3 and the third column C3 can be measured between the geometric center of the red LED 26A of the first pixel 22A and the geometric center of the red LED 26B of the second pixel 22B, as shown in FIG. 3. In another example, the internal pixel spacing $PS_{int}$ can be measured between a point on the periphery of one of the LEDs 26, 28, 30 in the pixel 22. For example, the internal pixel spacing $PS_{int}$ between the second pixel 22B (in the third row R3 and the third column C3) and a third pixel 22C (in the second row R2 and the third column C3) can be measured between the bottom-most point of the green LED 28B of the second pixel 22B and the bottom-most point of the green LED 28C of the third pixel 22C. In another example, the internal pixel spacing $PS_{int}$ between a fourth pixel 22D (in the second row R2 and the fourth column C4) and a fifth pixel 22E (in the first row R1 and the fourth column C4) can be measured from the right-most point of the blue LED 30D of the fourth pixel 22D and the right-most point of the blue LED 30E of the fifth pixel 22E). In yet another example, the internal pixel spacing $PS_{int}$ can be measured between the geometric centers of adjacent pixels 22, such as between the center point $CP_C$ of the third pixel 22C (in the second row R2 and the third column C3) and the center point $CP_D$ of the fourth pixel (in the second row R2 and the fourth column C4). As can be seen in FIG. 3, although four different reference points were used to determine the internal pixel spacing, the resulting measured distance for the internal pixel spacing $PS_{int}$ is the same in all four examples.

In an example, the internal pixel spacing $PS_{int}$ between pixels 22 that are on the same display module 12 is uniform throughout the entire array of pixels 22 mounted to that display module 12. But many displays are made up dozens if not hundreds of separate display modules, which are often mounted to a plurality of support chassis. If an external spacing, e.g., the spacing between the outermost pixels 22 mounted to one support chassis and the closest corresponding outermost pixels 22 mounted to an adjacent support chassis, is different from the internal spacing within an individual display module 12, then it will cause the display to appear to have seams or gaps in the image or video content that is being displayed.

As will be appreciated by those having skill in the art, the actual values for the internal pixel spacing $PS_{int}$ have been getting smaller and smaller over time as technology has improved, which have resulted in higher and higher resolutions for the displays. For example, in 2000 the smallest internal pixel spacing $PS_{int}$ that was common in the electronic display industry was 10 millimeters (mm). In 2010, the smallest internal pixel spacing $PS_{int}$ common in the same industry was 4 mm. At the time that the present application was filed, in 2020, a common internal pixel spacing $PS_{int}$ is about 2.5 mm, and internal pixel spacing $PS_{int}$ of 2 mm or less is expected to become more common.

Support Chassis

Figure 4:
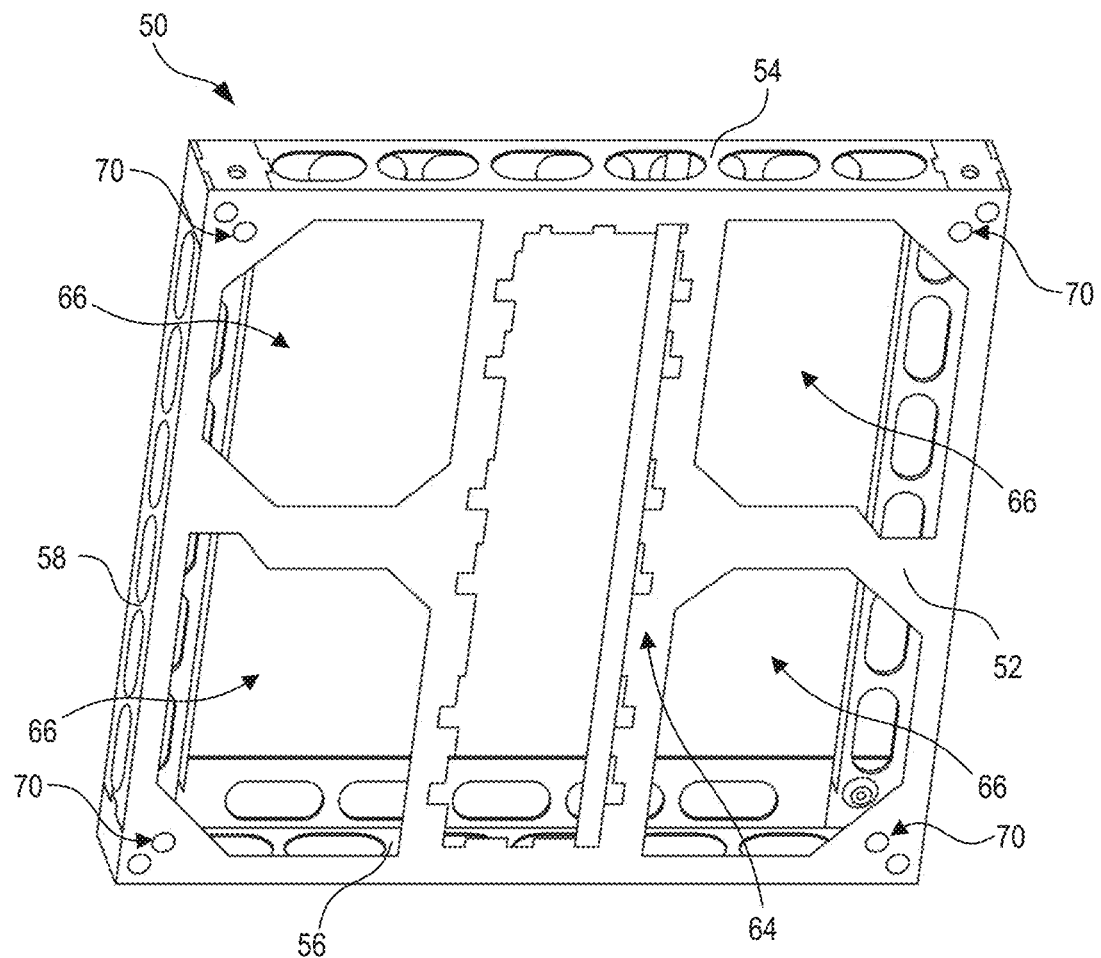
FIG. 4 is a front perspective view of an example support chassis onto which one or more display modules can be mounted to form an electronic display.
Figure 5:
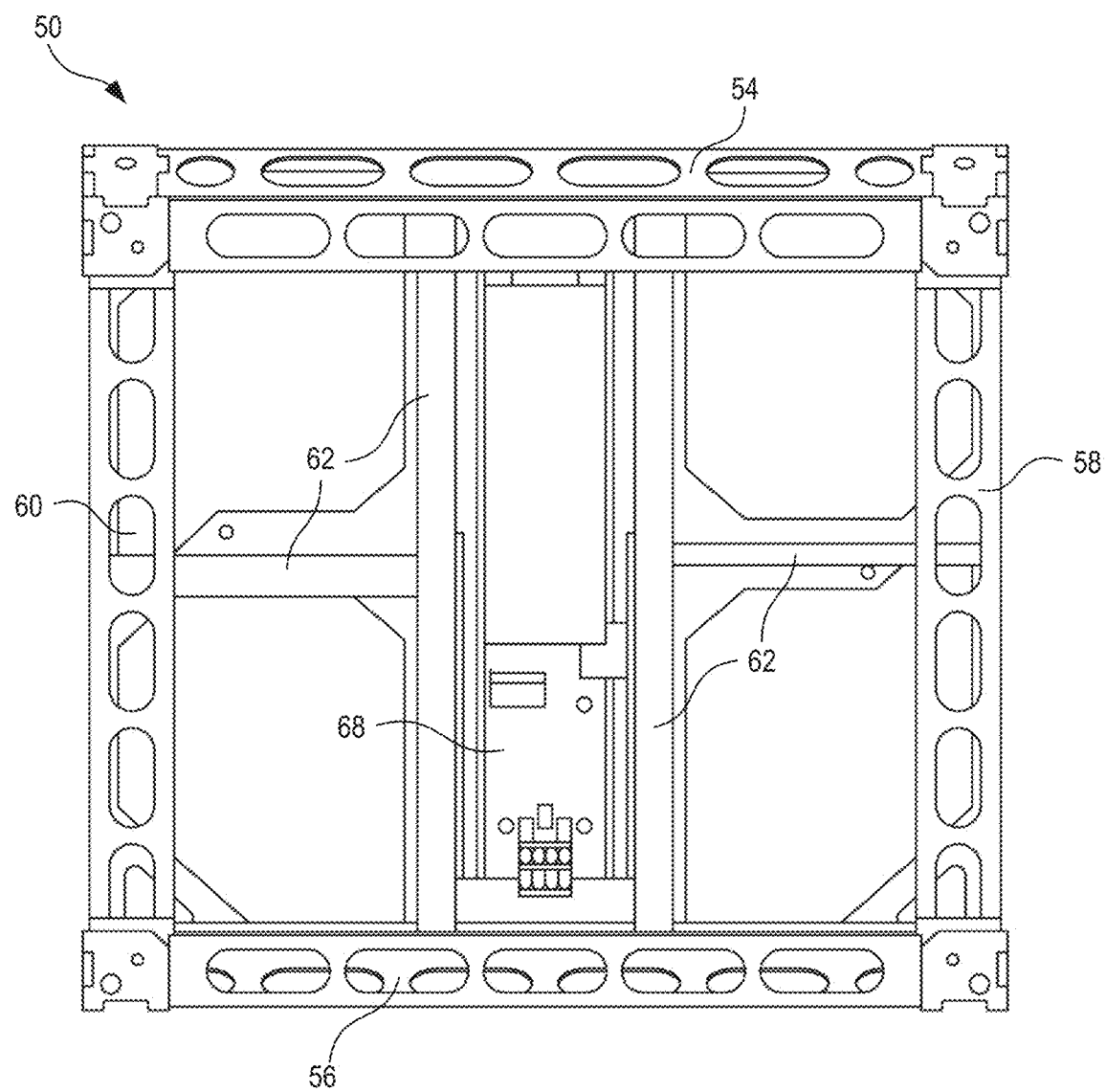
FIG. 5 is a rear perspective view of the example support chassis of FIG. 4.

FIGS. 4 and 5 show front and rear perspective views, respectively, of an example support chassis 50 in accordance with the present disclosure, which will also be referred to hereinafter as simply "the chassis 50." The chassis 50 is configured so that one or more display modules can be mounted to the chassis 50 in order to form on overall electronic display. For example, one or more of the chassis 50 can be used to form the chassis 14 in the display 10 of FIG. 1.

At present, a common manufacturing method for forming support chassis or frames for supporting the display modules of an electronic display is die casting. While manufacturing chassis or frames via die casting is relatively easy and inexpensive on a per-unit basis, it generally involves a relatively high initial capital cost for the casting equipment and the metal dies. Therefore, die cast chassis are generally only economically viable if a large number of the chassis are made. This tends to limit the flexibility of the party manufacturing the chassis and makes customizing designs for small-batch applications economically unfeasible.

In addition, while die casting can provide for a high degree of consistency for the structure that comes out of the die, it is still difficult for die casting to form the desired structure with absolute precision. Therefore, it is often common for the cast structure that exits the die to have imperfections, such as divots or projections, that can interfere with one or more surfaces of the structure. In the case of a chassis that is intended to support one or more display modules 12, these imperfections can interfere with mounting of one or more display modules 12 onto the chassis so that the one or more display modules 12 do not sit fully flush against the chassis, which can cause distortion of the image or video that is to be displayed on the overall display surface 16 of the display 10. Imperfections can also interfere when two of the chassis are abutted against each other, such as by preventing proper alignment of the two abutted chassis such that the front mounting surfaces of the chassis may not be aligned as desired, which can also distort the image or video being displayed. Some of these imperfections from die casting can be removed by machining or conditioning one or more surfaces of the chassis, but this machining results in an additional processing step in the manufacturing process, which adds to the manufacturing cost and the manufacturing time required.

The support chassis 50 of the present disclosure is formed by a novel method of manufacture that is substantially more economically viable compared to die casting and other current methods of manufacturing support chassis for supporting display modules in order to form an overall display. The novel method involves the use of sheet metal pieces, which can be relatively easily shaped such as with punching, cutting, or precision bending, and the relatively new method of laser welding to couple the shaped sheet metal pieces together in order to form the chassis 50.

As can be seen in FIGS. 4 and 5, the example chassis 50 includes a front wall 52, a top wall 54, a bottom wall 56, a first side wall 58, and a second side wall 60. In the view shown in FIGS. 4 and 5, the first side wall 58 is on the left side and the second side wall 60 is on the right side of the chassis 50 when looking from the front, such that the first side wall 58 will be referred to as "the left side wall 58" and the second side wall 60 will be referred to as "the right side wall 60" for the sake of clarity. In the example shown, the chassis 50 also includes one or more internal support structures 62, also referred to hereinafter as "internal supports 62," which can provide additional structural integrity for the chassis 50, e.g., for added rigidity for the chassis 50, and can also provide additional structures for mounting electronics that may be necessary for running the display 10.

The front wall 52 includes a front mounting face 64 onto which one or more of the display modules that will make up the display can be mounted. The front wall 52 can include mounting openings 66 that are sized and shaped to accommodate a portion of the display module, for example to position the display module relative to the chassis 50 so that the display module will be positioned at a specified position relative to the chassis 50. Each mounting opening 66 can also be sized and shaped to allow for electrical connection of a display module, e.g., with electrical wires for providing power and/or a communication link between the display module and electronics 68 located within the chassis 50 (such as a power supply or a controller) or to another device or structure located outside of the chassis 50. In an example, the front wall 52 can also include one or more mounting structures for engaging with a fastening structure in order to couple the display module to the chassis 50, such as the fastener openings 70 for receiving a latch or other fastening structure shown in FIG. 4.

In some examples, the chassis 50 is constructed from components that are made primarily or exclusively from pre-formed sheet metal. As will be appreciated by those having skill in the art, sheet metal is manufactured so that each sheet is planar or substantially planar with a high degree of certainty. In contrast, it can be difficult to form structures with perfectly planar or substantially planar surfaces when making those structures via metal die casting methods, as is presently the most common method of manufacturing electronic display chassis, at least without having to further machine the die cast structure to plane the surfaces down to a sufficiently flat and planar profile.

If sheet metal is used as the primary or exclusive building material to form the chassis 50 it can have other advantages that allow it to more easily ensure the planar or substantially planar front mounting face 64 that will be aligned or substantially aligned with the front mounting faces 64 of other chassis 50 that are adjacent to the chassis 50 in question. For example, because sheet metal has been used in industry for decades, there are methods of cutting and shaping sheet metal with considerable precision. For example, sheet metal pieces can be cut to a specified shape via metal punching or laser cutting, e.g., to cut the overall outline of a particular sheet metal piece or to cut openings within the interior of a particular sheet metal piece. Sheet metal can also be precisely bent, such as with a press brake, to ensure that the bend is to a specified angle. Sheet metal is also relatively easy to machine in the event that a portion of a particular sheet metal piece must be machined.

Figure 6:
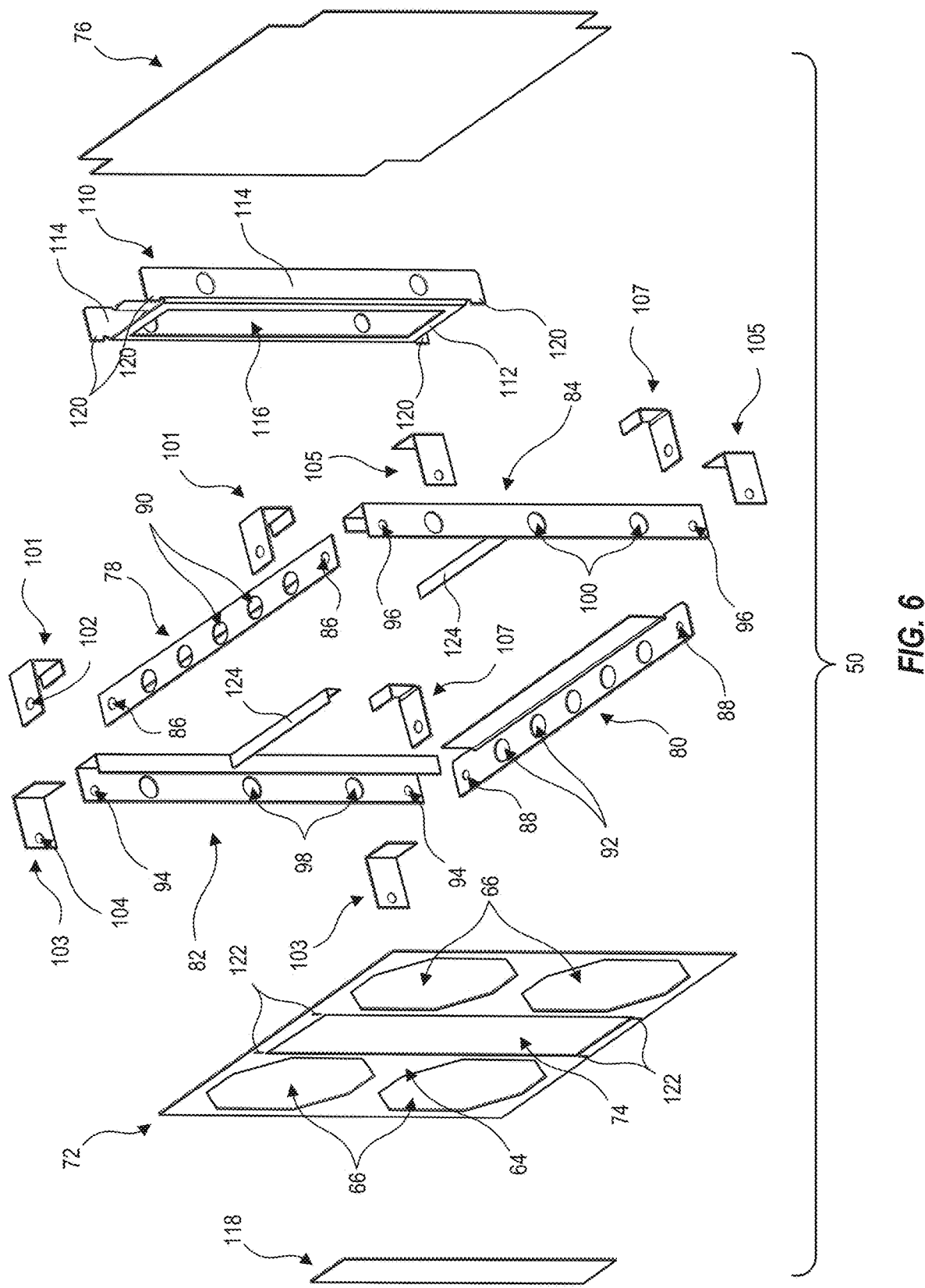
FIG. 6 is an exploded perspective view of the example support chassis of FIGS. 4 and 5 showing the different example components that can make up the support chassis.
Figure 7:
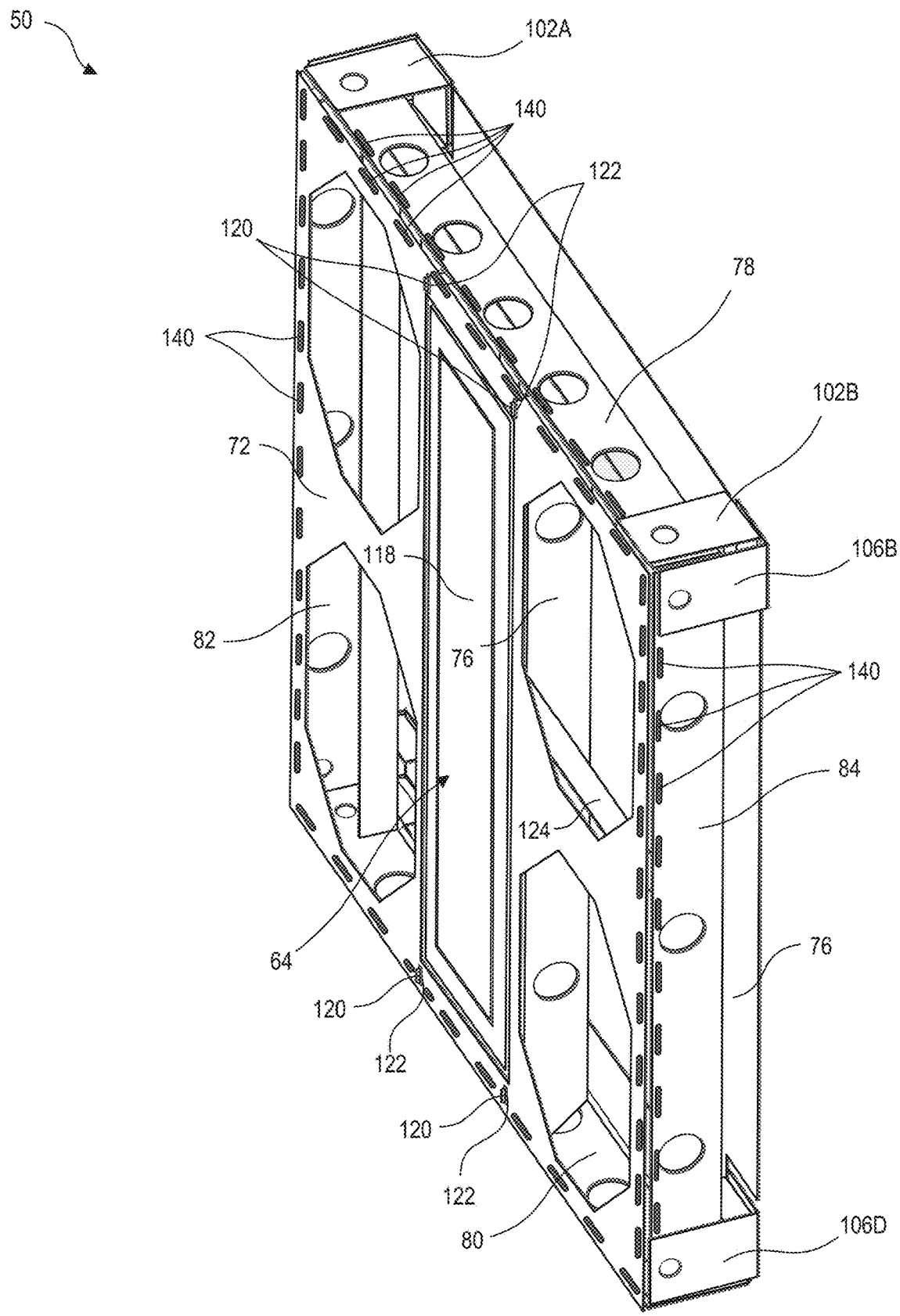
FIG. 7 is a perspective view of the example support chassis of FIG. 4-6 after assembly.

FIG. 6 shows an exploded perspective view of example components that can be formed by sheet metal pieces that can combined to make the example support chassis 50. FIG. 7 shows a perspective view of the components assembled to form the final support chassis 50. In an example, the major surfaces of the chassis, e.g., the front wall 52 and a rear wall, can each be formed from a single piece of flat sheet metal. In the example, a first component that makes up part of the final chassis 50 is a front wall piece 72, which will take the form of the front wall 52 in the final chassis 50. A major planar surface of the front wall piece 72 can make up at least a portion of the front mounting face 64 onto which the display modules are mounted. The front wall piece 72 can include the mounting openings 66 to accommodate a portion of a display module being coupled to the chassis 50. In an example, the front wall piece 72 also includes a support piece opening 74 for receiving another sheet metal piece that forms the chassis 50, such as a vertical support piece 110 (described below). The front wall piece 72 can also include one or more structures for engaging the one or more display modules so that the one or more display modules can be mounted to the chassis 50, such as openings to receive a latch or other mounting structure (not shown in FIGS. 6 and 7).

In an example, the front wall piece 72 is formed from a single piece of sheet metal that has been cut to the specified dimensions of the front wall 52 (e.g., with a specified height and a specified width), and wherein any openings or cutouts in the front wall 52 (such as the display module mounting openings 64 and the support piece opening 74) are cut or punched out of the piece of sheet metal that is to form the front wall piece 72. In other examples, the front wall piece 72 can be formed from a plurality of pieces of sheet metal that are positioned in a side-by-side manner in order to form the overall shape of the front wall 52, including any negative space corresponding to openings in the front wall 52.

In an example, the components that form the final chassis 50 also include a rear wall piece 76 opposing or substantially opposing the front wall piece 72, wherein the rear wall piece 76 will take the form of the rear wall in the final chassis 50. The rear wall piece 76 can act as a rear cover for the chassis 50. In an example (not shown), the rear wall piece 76 can include one or more structures for coupling the chassis 50 to an overall display support (not shown), such as to a wall, a sign structure, or other edifice in order to support the weight of the display.

In an example, the rear wall piece 76 is formed from a single piece of sheet metal that has been cut to the specified dimensions of the front wall (e.g., with a specified height and a specified width), and wherein any openings or cutouts in the rear wall piece 76 are cut or punched out of the piece of sheet metal that is to form the rear wall piece 76. In other examples, the rear wall piece 76 can be formed from a plurality of pieces of sheet metal that are positioned in a side-by-side manner in order to form the overall shape of the rear wall.

In an example, the front and rear wall pieces 72 and 76 are coupled to a frame made up of the top wall 54, the bottom wall 56, and the side walls 58, 60. In an example, the frame can be formed by separate wall pieces 78, 80, 82, and 84 (collectively referred to hereinafter as "the frame wall pieces 78, 80, 82, 84" or simply "the frame pieces 78, 80, 82, 84"), wherein each of the top wall 54, the bottom wall 56, the left side wall 58, and the right side wall 60 are formed by one or more of the separate frame wall pieces 78, 80, 82, 84. For example, a top wall piece 78 can form the top wall 54, a bottom wall piece 80 can form the bottom wall 56, a first side wall piece 82 can form the first side wall 58 (e.g., on the left side of the chassis 50 when looking at the front of the chassis 50, so that the first side wall piece 82 will be referred to as "the left wall piece 82" for the sake of clarity), and a second side wall piece 84 can form the second side wall 60 (e.g., on the right side of the chassis 50 when looking at the front of the chassis 50, so that the second side wall piece 84 will be referred to as "the right wall piece 84" for the sake of clarity).

In an example, one or more of the frame pieces 78, 80, 82, 84 are each made from a single piece of sheet metal that is then shaped into the specified configuration that form the resulting walls 54, 56, 58, 60 of the final chassis 50. For example, the top wall piece 78 and the bottom wall piece 80 can each be formed from a relatively narrow and long piece of sheet metal that has been bent or otherwise shaped into a bar or beam with a L-shaped cross section (as is best seen for the bottom wall piece 80 in FIG. 6). The L-shaped cross section of the top and bottom wall pieces 78, 80 will give the resulting top and bottom walls 54 and 56 more rigidity than if the top and bottom walls were formed only from a flat, non-bent sheet. In an example, the rear members of the L-shaped pieces 78, 80 (i.e., the portion that extend downward for the top wall piece 78 and the portion that extends upward for the bottom wall piece 80) is aligned with the rear wall piece 76 such that they can provide part of a bearing surface that the rear wall piece 76 can be mounted onto in order to form a rear wall of the chassis 50. The top and bottom wall pieces 78, 80 can each have various openings punched or cut therein, which can serve various purposes, such as fastener openings 86 in the top wall piece 78 and fastener opening 88 in the bottom wall piece 80 for receiving fasteners or other coupling structures, or ventilation openings 90 and 92 in the top and bottom wall pieces 78 and 80, respectively.

Similarly, the left and right side wall pieces 82 and 84 can each be formed from a long piece of sheet metal that has bent or otherwise shaped into a generally U-shaped, J-shaped, or L-shaped cross section, which can provide structural rigidity in the vertical direction. In an example, the rear members of the J-shaped pieces 82, 84 (i.e., the portion that extend rightward for the left wall piece 82 and the portion that extends leftward for the right wall piece 84) is aligned with the rear wall piece 76 such that they can provide part of a bearing surface that the rear wall piece 76 can be mounted onto in order to form the rear wall of the chassis 50. Like the top and bottom wall pieces 78, 80, the left and right wall pieces 82, 84 can include one or more openings that are cut or punched therein, such as fastener openings 94 and 96 in the left and right wall pieces 82 and 84, respectively, for receiving fasteners or other coupling structures, or ventilation openings 98 and 100 in the left and right wall pieces 82 and 84, respectively.

In an example, the frame pieces 78, 80, 82, 84 can be coupled together with one or more corner pieces at each intersection between two of the frame pieces 78, 80, 82, 84. In the example shown in FIG. 6, at each corner intersection, there is a top or bottom corner piece that is positioned primarily above the top wall piece 78 or primarily below the bottom wall piece 80 and a side corner piece that is positioned outside of the side wall piece 82, 84, wherein the top or bottom corner piece engages with the side corner piece such that the top or bottom wall piece 78, 80 will be effectively coupled to a corresponding side wall piece 82, 84. For example, at the intersection between the top wall piece 78 and the left wall piece 82, there is a top corner piece 101 that is configured to be coupled to the top wall piece 78 (such as with a fastener that passes through a fastener opening 102 in the top corner piece 101 and the fastener opening 86 in the top wall piece 78) and a left side corner pieces 103 that is configured to be coupled to the left wall piece 82 (such as with a fastener that passes through a fastener opening 104 in the side corner piece 103 and the fastener opening 94 of the left wall piece 82). The top corner piece 101 and the side corner piece 103 can engage with one another so that the top wall piece 78 and the left wall piece 82 are coupled together. For example, the top corner piece 101 and the side corner piece 103 can be coupled together with a fastener (not shown), or they can be welded together, or they can be shaped so that they form an interference fit to hold the top wall piece 78 and the left wall piece 82 together. A similar pair of corner pieces can be used at each of the other intersections between the top and bottom wall pieces 78, 80 and the left and right wall pieces 82, 84. For example, at the intersection between the top wall piece 78 and the right wall piece 84 there can be a top corner piece 101 and a right side corner piece 105, at the intersection between the bottom wall piece 80 and the left wall piece 82 there can be a bottom corner piece 107 and a left side corner piece 103, and at the intersection between the bottom wall piece 80 and the right wall piece 84 there can be a bottom corner piece 107 and a right side corner piece 105.

The one or more corner pieces 101, 103, 105, 107 at each corner intersection can also include one or more abutting surfaces of contact for an adjacent chassis 50 so that when two adjacent chassis 50 are abutted against each other, they will be aligned with respect to each other as specified for the overall appearance of the display. In an example, the corner pieces 101, 103, 105, 107 can also act to maintain a specified spacing between the adjacent chassis 50 so that an internal pixel spacing will be maintained across the entire display and in particular between display modules that are mounted to the adjacent chassis 50 (as described in more detail below). For example, the top corner pieces 101 of a first chassis 50 can engage with the bottom corner pieces 107 of a second chassis 50 that is directly above the first chassis 50. The left side corner pieces 103 of the first chassis 50 can engage with the right side corner pieces 105 on the right side of a third chassis 50 that is directly to the left of the first chassis 50. The right side corner pieces 105 on the right side of the first chassis 50 can engage with the left side corner pieces 103 on the left side of a fourth chassis 50 that is directly to the right of the first chassis 50. Finally, the bottom corner pieces 107 of the first chassis 50 can engage with the top corner pieces 101 of a fifth chassis 50 that is directly below the first chassis 50.

Those having skill in the art will be able to envision other configurations of structures that can couple together a pair of the frame pieces 78, 80, 82, 84 at a corner intersection without varying from the scope of the present disclosure, including single corner pieces instead of the paired top or bottom corner piece 101, 107 and side corner pieces 103, 105 described above with respect to FIG. 6 or directly coupling each side wall piece 82, 84 to the corresponding portions of the top and bottom wall pieces 78, 80 (such as with the laser welding methods described in more detail below).

As noted above, the chassis 50 can include one or more internal supports, such as the internal supports 62 described above with respect to FIGS. 4 and 5. In an example, the internal supports can include a vertical support piece 110 that can fit within the frame formed by the frame pieces 78, 80, 82, 84 to provide additional rigidity and structural integrity for the chassis 50 in a vertical direction. In an example, the vertical support piece 110 can be formed from a single piece of sheet metal that is cut or punched into a specified shape. In an example, the specified shape includes a middle section 112 that is aligned in the same plane as the front wall piece 72 and a pair of side sections 114 that are bent relative to the middle section 112 such that the side sections 114 are aligned with the side wall pieces 82, 84. In an example, the side sections 114 can also include rear portions that are bent to be aligned with the rear wall piece 76 such that they can provide part of a bearing surface that the rear wall piece 76 can be mounted onto in order to form a rear wall of the chassis 50. In an example, the space between the side sections 114 can act as a cavity for the electronics 68 (as can be seen in the rear view of FIG. 5). In an example, the vertical support piece 110 includes ventilation openings 116 that can allow for cross-ventilation within the cabinet of the chassis 50 during operation of the display.

As can be seen in FIGS. 6 and 7, in an example, the vertical support piece 110 can fit within the support piece opening 74 in the front wall piece 72 so that the vertical support piece 110 will be accessible from the front of the chassis 50. In addition, the front section 112 of the vertical support piece 110 can include an opening 116 for a cover 118. In an example, the cover 118 can be removably coupled to the vertical support piece 110 such that the cover 118 can be taken off to allow for maintenance of the electronics 68 that can be positioned within the cavity formed between the side sections 114 and the rear wall piece 76. The cover 118 can also provide a portion of the front mounting face 64 onto which the display modules are mounted after the chassis 50 has been assembled.

The vertical support piece 110 can be coupled to the rest of the chassis 50 via any coupling structure that will be sufficiently secure to maintain a specified positioning and orientation of the vertical support piece 110 relative to the other components of the chassis 50. In the example shown in FIGS. 6 and 7, the vertical support piece 110 includes a set of one or more tabs 120 that can be inserted into one or more slots in another structure of the chassis 50, such as the slots 122 in the front wall piece 72 shown in FIGS. 6 and 7.

In an example, the one or more internal supports of the chassis 50 can include one or more horizontal support pieces 124 to provide additional structural integrity to the chassis 50 in a horizontal direction. The combination of the vertical support piece 110 and the one or more horizontal support pieces 124 can provide the assembled chassis 50 with a specified rigidity and structural integrity in the vertical and horizontal directions. In an example, each of the one or more horizontal support pieces 124 is formed from a single piece of sheet metal that has been bent into an L-shaped cross-section to provide for at least a portion of the specified structural integrity in the horizontal direction.

In some examples the chassis 50 and the manufacturing process that makes it are designed such that each chassis 50 includes one or both of:
  a) a front mounting face 64 that is planar or substantially planar so that when the display modules 12 are mounted to the front mounting face 64, then front faces 20 of the display modules 12 that are mounted to the same front mounting face 64 will be in the same plane or substantially in the same plane; and
  b) side surfaces (such as the abutting surfaces on the sides of the side corner pieces 103, 105 or the abutting surfaces on the top and bottom of the top and bottom corner pieces 101, 107) that are planar or substantially planar and that are normal or substantially normal relative to the planar or substantially planar front mounting face 64, so that when a plurality of the chassis 50 are combined to form a larger overall support system, the front mounting face 64 of each of the plurality of chassis 50 will be aligned or substantially aligned with all the other front mounting faces 64 of the plurality of chassis 50 that make up the overall support system.

Figure 8:
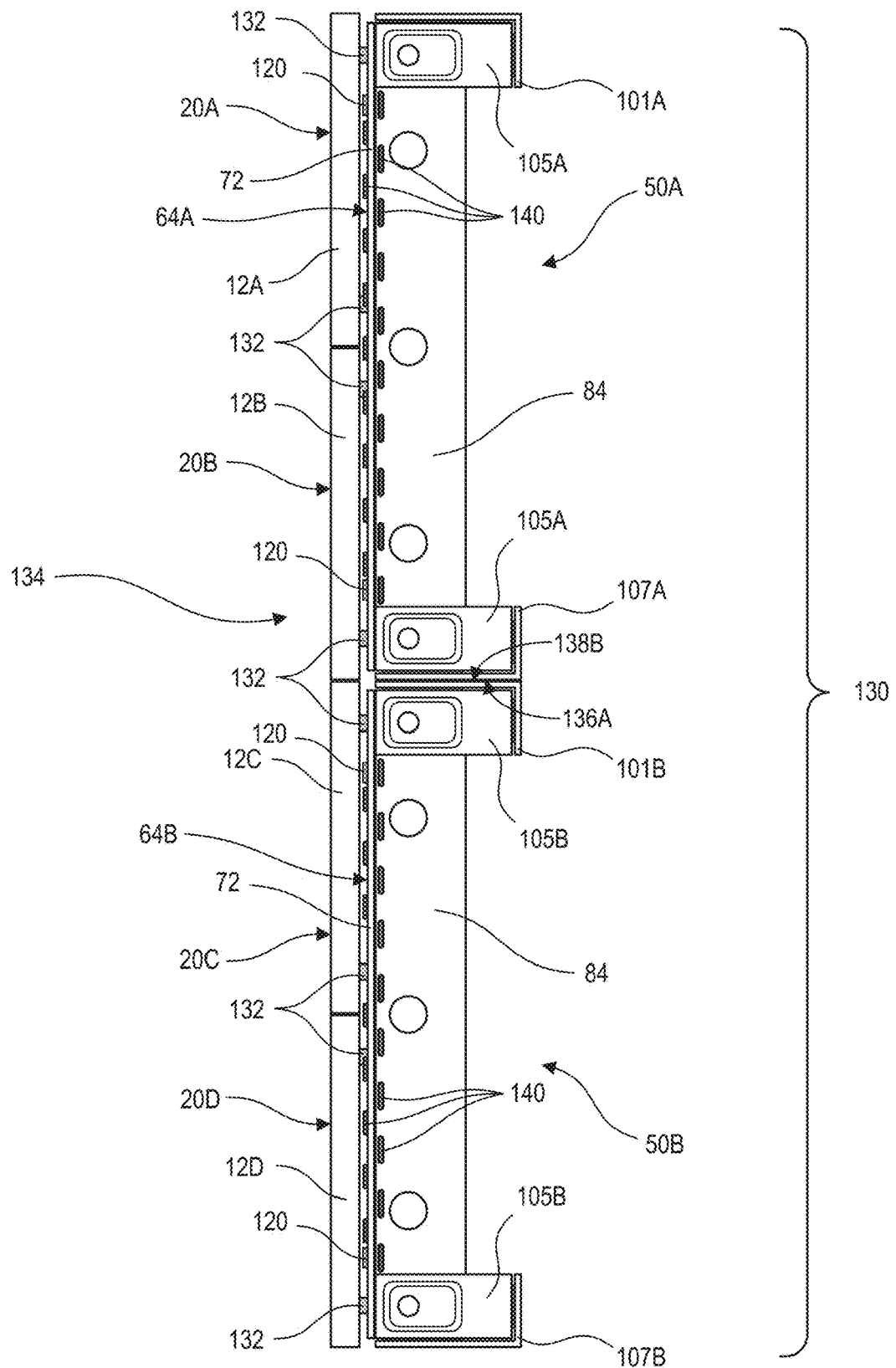
FIG. 8 is a side view of a pair of the example support chassis of FIGS. 4-7 mounted one on top of the other with a plurality of display modules mounted to the front faces of the support chassis.

FIG. 8 is a side view of a pair of support chassis 50A and 50B that are abutted against one another, e.g., such that the two chassis 50A, 50B form a larger overall support system 130. In other examples, the two chassis 50A and 50B are part of the entire overall support system 130, which can include more than two chassis 50, and in some examples many more than two chassis 50. In the example shown in FIG. 8, a plurality of display modules 12A, 12B, 12C, and 12D (collectively referred to as "the display modules 12") are mounted to each chassis 50A, 50B, such as with fastening structures 132 (which can be fasteners, latches, or any other appropriate structure for coupling a display module 12 to one of the chassis 50A, 50B). The chassis 50A, 50B are configured so that the front face 20A, 20B, 20C, 20D (collectively referred to as "the front faces 20") of the display modules 12 are aligned in the same plane or substantially in the same plane to form an overall display surface 134 that is also planar or substantially planar. The precision manufacturing of the chassis 50A, 50B can ensure that this planar or substantially planar alignment of the display module front faces 20 can be achieved.

As described above, each chassis 50A, 50B includes a corresponding front mounting face 64A, 64B. As described above, since the front mounting face 64 is formed as one of the surfaces of the front wall piece 72, which is formed from planar or substantially planar piece of sheet metal, the front mounting faces 64A, 64B of the chassis 50A, 50B are each planar or substantially planar. In addition, the ability to precisely form the components of the chassis 50A, 50B can ensure that the surface or surfaces of the first chassis 50A that will be abutted against the second chassis 50B will also be planar or substantially planar. In addition, the precision forming of the components of the chassis 50A, 50B can ensure that these abutment surfaces will also be aligned with the front mounting face 64A, 64B of the chassis 50A, 50B so that when the first chassis 50A is abutted against the second chassis 50B, the front mounting face 64A of the first chassis 50A will be aligned or substantially aligned in the same plane or substantially the same plane as the front mounting face 64B of the second chassis 50B.

In the example shown in FIG. 8, a surface of the first chassis 50A that abuts against the second chassis 50B is a bottom surface 136A of the bottom corner piece 107A, which abuts against a top surface 138B of the top corner piece 101 of the second chassis 50B. The method of forming the chassis 50A, 50B is such that when the chassis 50A, 50B are assembled, the bottom surfaces 136A of the bottom corner pieces 107A of the first chassis 50A are normal or substantially normal to the front mounting face 64A of the first chassis 50A, and the top surfaces 138B of the top corner pieces 101B of the second chassis 50B are normal or substantially normal to the front mounting face 64B of the second chassis 50B. When the bottom surfaces 136A of the bottom corner pieces 107A of the first chassis 50A are normal or substantially normal to the front mounting face 64A and the top surfaces 138b of the top corner pieces 101B of the second chassis 50B are normal or substantially normal to the front mounting face 64B, then the front mounting face 64A of the first chassis 50A will be parallel or substantially parallel to the front mounting face 64B of the second chassis 50B and, if they are aligned, the front mounting faces 64A and 64B will be co-planar or substantially co-planar, as desired to form a planar or substantially planar overall display surface 134.

The resulting co-planar or substantially co-planar front mounting faces 64A, 64B can ensure that the display modules 12A, 12B, 12C, 12D that are mounted to the front mounting faces 64A, 64B will be aligned or substantially aligned with each other. In an example, this can ensure that that the front face 20A of a first display module 12A is aligned or substantially aligned with the front face 20B of a second display module 12B on the first chassis 50A and that the front face 20C of a third display module 12C is aligned or substantially aligned with the front face 20D of a fourth display module 12D on the second chassis 50B. The co-planar or substantially co-planar alignment of the front mounting faces 64A, 64B of the first and second chassis 50A, 50B can then ensure that the front faces 20A, 20B of the display modules 12A, 12B mounted to the first chassis 50A are aligned or substantially aligned with the front faces 20C, 20D of the display modules 12C, 12D mounted to the second chassis 50B, which in turn can ensure that all four front faces 20A, 20B, 20C, and 20D are aligned, that is that all four front faces 20A, 20B, 20C, 20D are co-planar or substantially co-planar in order to form the planar or substantially planar overall display surface 134.

In other examples, any surface of a chassis 50 that is to be abutted against an adjacent chassis 50 will be normal or substantially normal to the front mounting face 64 of that chassis 50. For example, when the side walls 58, 60 of two adjacent chassis 50 are abutted against each other, the outside surfaces of the left side corner pieces 103 can be abutted against corresponding outside surfaces of the right side corner pieces 105 of the adjacent chassis 50. In such a case, the outside surfaces of the side corner pieces 103, 105 can each be normal or substantially normal to the front mounting faces 64 of each corresponding chassis 50 so that when the side corner pieces 103, 105 are abutted against each other, their corresponding front mounting faces 64 will be coplanar or substantially coplanar, similar to how the front mounting face 64A of the first chassis 50A is co-planar or substantially co-planar with the front mounting face 64B of the second chassis 50B as shown in FIG. 8.

In a preferred example, all of the front mounting faces 64 of the plurality of chassis 50 that make up the entire overall support system 130 are aligned in the same plane or substantially in the same plane (i.e., are co-planar or substantially co-planar) so that the front mounting faces 64 form a larger overall mounting surface that is planar or substantially planar. The resulting planar or substantially planar overall mounting surface ensures that when the plurality of display modules 12 are mounted to the overall mounting surface, the front faces 20 of the display modules 12 will also be aligned in or substantially in a common plane so that the front faces 20 will form an overall display surface 134 that is planar or substantially planar.

The use of separate pieces of sheet metal as the primary or only material used to form the components of the chassis 50 (e.g., to form the front wall piece 72, the rear wall piece 76, the top wall piece 78, the bottom wall piece 80, the left side wall piece 82, the right side wall piece 84, the vertical support piece 110, and the horizontal support pieces 124), requires one or more methods of coupling the sheet metal components together. However, many fastening or coupling structures that have been conventionally used to couple sheet metal pieces together would be expected to result in some issues, especially when the internal pixel spacing $PS_{int}$ is small, e.g., 4 mm or less, such as 2.5 mm or less, for example 2 mm or less, such as 1 mm or less. For example, if conventional fasteners are used, such as nuts and bolts, there is typically a portion of the fastener that protrudes out beyond the profile of the sheet metal, which can make it challenging to abut one chassis 50 against and adjacent chassis 50 without the protruding portion interfering with the close fit that might be required to maintain the close internal pixel spacing $PS_{int}$.

In addition, other means of fastening, such as riveting or conventional arc welding, have been known to warp sheet metal components, for example because of the generation of thermal gradients, so that they may not remain planar or substantially planar. When a small internal pixel spacing $PS_{int}$ is specified, e.g., 4 mm or less, such as 2.5 mm or less, then even a very small amount of warping can result in the surfaces of the chassis being misaligned. The warping or other deformation of the sheet metal pieces can require further processing of the chassis to overcome the deformation, such as machining or reshaping.

In an example, two or more of the sheet metal components that are combined to form the chassis 50 are coupled together with laser welding to form one or more laser weld joints between each sheet metal piece being coupled together. "Laser welding," as that term is used herein, refers to the use of laser-based energy emission to form a weld joint between two metal pieces. An example of laser welding that can be used to form laser weld joints to form the chassis 50 of the present disclosure includes the laser welding performed by laser welding devices sold under the TRU-LASER trade name by Trumpf Werkzeugmaschienen GmbH+Co. KG, Ditzingen, Germany.

In an example, the laser that is used for laser welding can be configured to generate only the amount of heat energy necessary to form the joint with little to no excess heat generated, especially when compared to other types of welding such as arc welding. Laser welding is also known to have low heat penetration into the metal parts being welded and/or can form a weld joint with a considerably smaller size as compared to other methods of welding, both of which can reduce, minimize, or even eliminate heat-induced warping of the sheet metal as the weld joint is being formed. By reducing, minimizing, or eliminating heat-induced warping, the use of laser welding can more effectively ensure that the sheet metal pieces being joined will remain in their original planar or substantially planar state.

In addition, the lower temperature and low heat penetration of laser welding can also allow the weld joints that are formed to have relatively small seam profiles. As used herein, the term "seam" when referring to a laser weld, refers to the portion of metal that is melted or softened to form the weld joint, which is often raised slightly from the original surface of the metal part being joined. The relatively small seam resulting from laser welding can mean that the weld seam is less likely to interfere with the display modules 12 that are being mounted to the chassis 50 or with the flush contact of one chassis 50 with respect to an adjacent chassis 50 so that the weld seam does not unnecessarily displace the display module 12 or the adjacent chassis 50 as it abuts against the location of the weld seam.

In addition, laser welding allows for a great amount of flexibility regarding the location, size, and number of joints that are formed, so that if a particular seam profile of one of the chassis 50 protrudes enough from the surface being welded that it could interact with a corresponding weld seam on an adjacent chassis 50 that is to be abutted against the first chassis 50, than the welds can be positioned so that they will not be in contact with each other. In addition, even if one or more of the laser weld seams are formed such that they interfere with a proper flush fit and seating between the chassis 50 and another structure, the smaller size of the seams means that any machining or grinding that is needed to reduce the seam to a size that does not interfere will be minimized, decreasing the time and cost required to manufacture the chassis 50.

Figure 9:
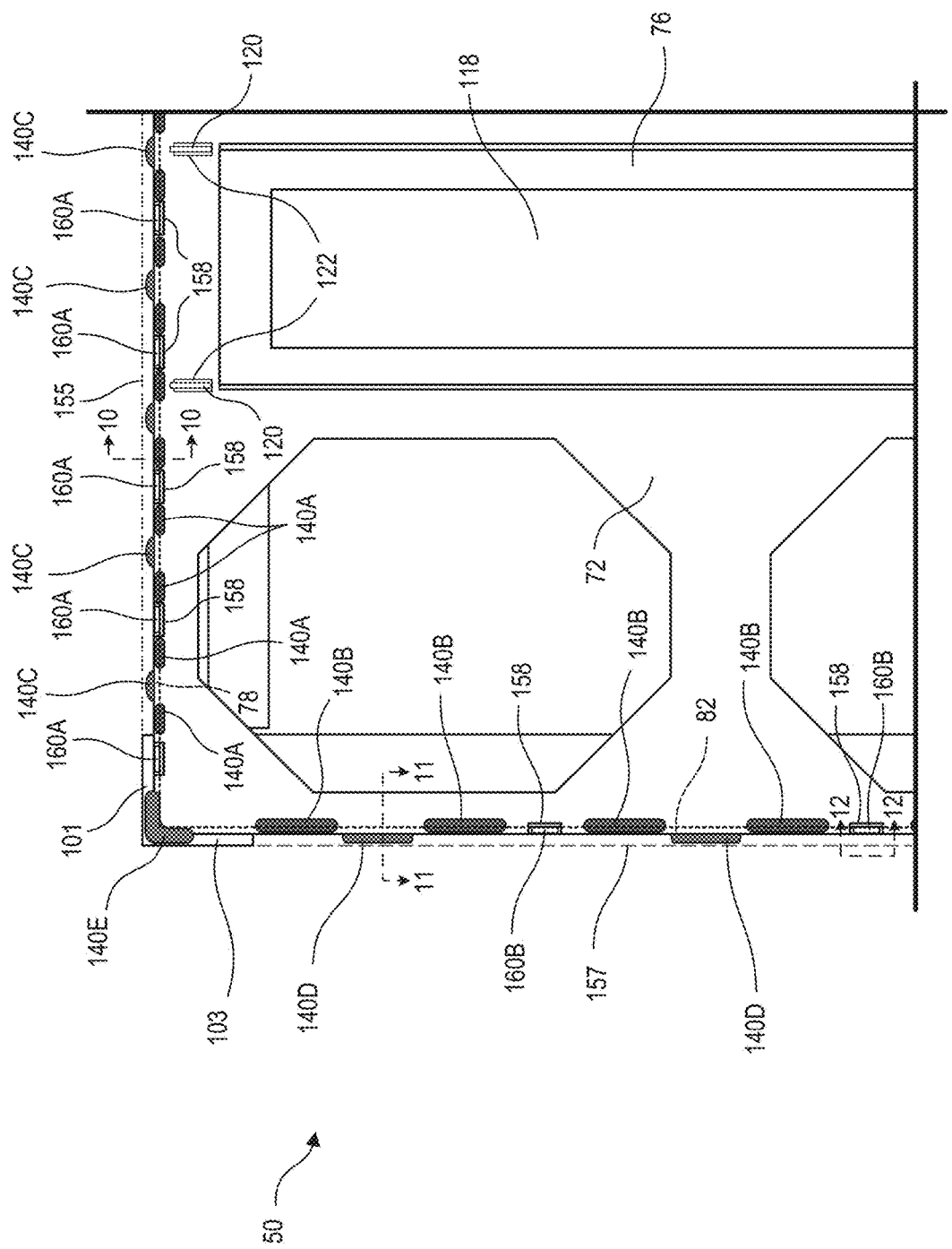
FIG. 9 is a partial front view of the example support chassis of FIGS. 4-8 showing details of example laser welds that can be implemented to couple components of the support chassis together.

FIG. 9 shows a close-up front view of the example support chassis 50 wherein the sheet metal pieces that form the chassis 50 (e.g., the front wall piece 72, the top wall piece 78, the bottom wall piece 80, and the side wall pieces 82, 84) are coupled together, at least in part with a plurality of laser weld joints 140A, 140B, 140C, 140D, 140E, and 140F (referred to generically or collectively hereinafter as "laser weld joints 140" or simply "weld joints 140"). Examples of laser weld joints 140 are also shown in FIGS. 7, 8, and 10-12. The specific configuration of the laser weld joints 140 shown in FIGS. 7-12 should not be considered as limiting, Rather, the specific positioning, sizes, and shapes of the laser weld joints 140 shown in the examples of FIGS. 7-12 were chosen for the purposes of illustration and discussion, not as a limiting specific configuration for any particular weld joint 140.

In the example of FIG. 9, the front wall piece 72 is coupled to each of the frame pieces 78, 80, 82, 84 by one or both of a plurality of front weld joints 140A, 140B or a plurality of side weld joints 140C, 140D. In an example, the front weld joints 140A, 140B are formed such that the joint 140A, 140B passes through the thickness of the front wall piece 72 and a portion of the way into the corresponding frame piece 78, 80, 82, 84 at the edge of the frame piece 78, 80, 82, 84. For example, as shown in the cross-sectional view of FIG. 10, the front weld joint 140A can include a small seam 142A that runs along a front surface 144 of the front wall piece 72 and that protrudes forward from the front surface 144. The front weld joint 140A also includes a joint stem 146A that extends through the thickness of the front wall piece 72, past an outer edge 148 of the top wall piece 78, and into the bulk of the top wall piece 78.

Figure 11:
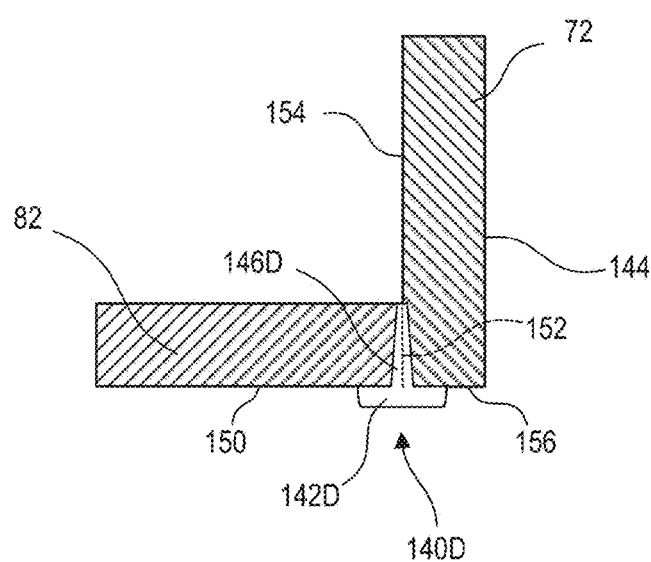
FIG. 11 is a cross-sectional view of a portion of the support chassis of FIGS. 4-9 taken along line 11-11 in FIG. 9.
Figure 12:
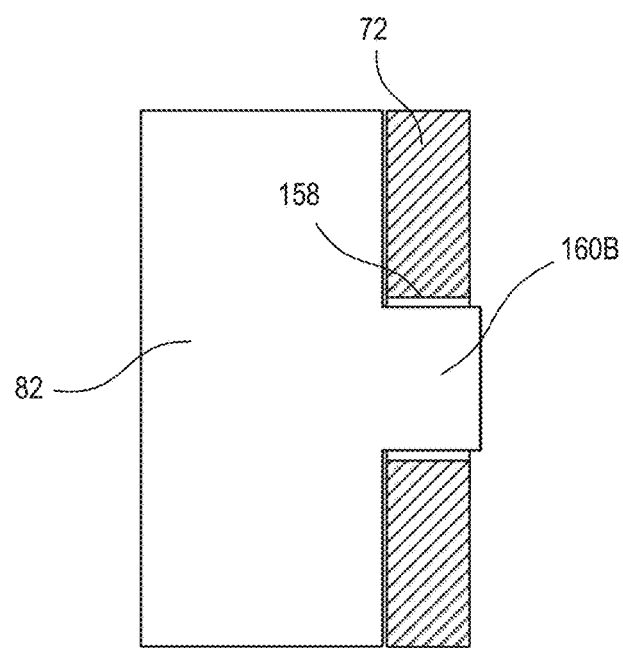
FIG. 12 is a cross-sectional view of a portion of the support chassis of FIGS. 4-9 taken along line 12-12 in FIG. 9.

In an example, the side weld joints 140C, 140D are formed such that the joint 140C, 140D passes through the thickness of the particular frame piece 78, 80, 82, 84 along the edge of that particular frame piece 78, 80, 82, 84 and also passes through a portion of the front wall piece 72 along the surface that is abutted against the edge of the particular frame piece 78, 80, 82, 84. For example, as shown in FIG. 11, the side weld joint 140D that is joining the front wall piece 72 and the side wall piece 82 can include a small seam 142D that runs along an outer surface 150 of the side wall piece 82, across the abutment point 152 where the edge of the side wall piece 82 is abutted against a rear surface 154 of the front wall piece 72, and along a portion of an outer edge 156 of the front wall piece 72. The joint seam 142D protrudes laterally outward from the outer surface 150 of the side wall piece 82 and the outer edge 156 of the front wall piece 72. The side weld joint 140D also includes a joint stem 146D that extends through the thickness of the side wall piece 82 and along a portion of the rear surface 154 of the front wall piece 72. In an example, the joint stem 146D extends all the way or substantially all the way through the thickness of the side wall piece 82.

As noted above, laser welding is able to produce weld joints 140 with low heat input and low heat penetration so that the seam formed by the weld joint 140 protrudes a very small amount from the surface onto which the weld joint 140 was applied. For example, as shown best in FIG. 9, the side weld joints that couple a frame piece 78, 80, 82, 84 to the front wall piece 72, such as the side joints 140C or the side joints 140D, can be formed in such a way that they protrude away from their corresponding frame piece 78, 80, 82, 84 a distance that is less than the amount that the abutting surfaces of the chassis 50 extend beyond the frame piece 78, 80, 82, 84. As described above, in the example chassis 50 described herein, the abutting surfaces (e.g., the surfaces that are abutted against a corresponding abutting surface of another adjacent chassis 50) can include a top surface of the top corner piece 101 or an outside surface of the side corner piece 103. Therefore, in an example, the side joints 140C protrude from the top wall piece 78 to a "height" that is lower than the "height" of the top surface of the top corner piece 101. Similarly, the side weld joints 140D protrude from the side piece 82 by a "height" that is less than the "height" of an outer surface of the side corner piece 103. In FIG. 9, the "height" of the top surface of the top corner piece 101 away from the top wall piece 78 is represented by dashed line 155, while the "height" of the outer surface of the side corner piece 103 away from the side wall is represented by dashed line 157. As can be seen in FIG. 9, the side weld joints 140C protrude from the top wall piece 78 by less than the height of the top corner piece 101 (line 155) and the side weld joints 140D protrude from the side wall piece 82 by less than the height of the side corner piece 103 (line 157). Therefore, the side weld joints 140C and 140D will not come into contact with an adjacent chassis 50 that is abutted against the chassis 50 shown in FIG. 9 because, in theory, the adjacent chassis 50 will have no structures that extend beyond the "height" of the abutting surface or surfaces. In other words, no structure of an adjacent support chassis 50 will extend beyond the line 155 on top of the chassis 50 shown in FIG. 9 or beyond the line 157 on the side of the chassis 90 shown in FIG. 9.

Laser welding is amenable to automation and high-precision computer and robotic control over the resulting laser weld joints. Because the laser weld joints 140 can be formed with such high precision, the laser weld joints 140 can be formed while affecting only a small area and can be formed in a large variety of joint geometries and configurations so that pieces being joined can be laser welded together with a practically infinite number of configurations. In the example configuration shown in FIG. 9, a first set of front weld joints 140A and side weld joints 140C have a first configuration (e.g., a first size and shape) along the top wall piece 78, while a second set of front weld joints 140B and side weld joints 140D have a second configuration (e.g., a second size, which could be smaller or larger than the first size and/or a second shape) along the side wall piece 82. In another example, the chassis 50 includes a corner weld joint 140E that is angled so that it can overlap the corner pieces 101, 103 and the front wall piece 72 to join the pieces 72, 102A, 106A together. The two types of front weld joints 140A, 140B, the two types of side weld joints 140C, 140D, and the corner weld joint 140E shown in FIG. 9 are merely an example showing that more than one configuration of joint is possible even on the same chassis 50.

Figure 10:
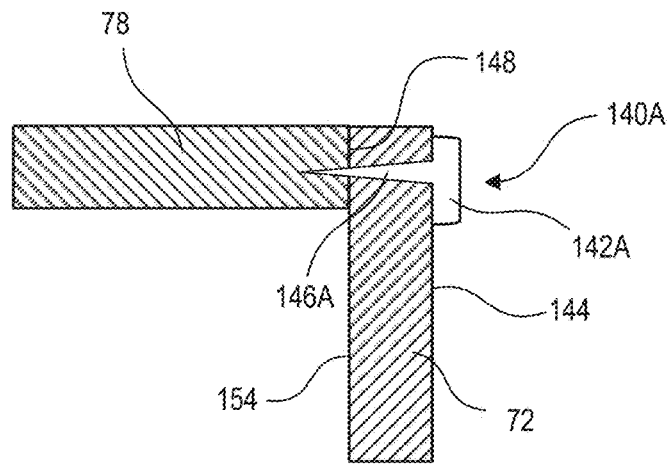
FIG. 10 is a cross-sectional view of a portion of the support chassis of FIGS. 4-9 taken along line 10-10 in FIG. 9.

In addition, the precision of laser welding allows for more variety in what types of substrates are being joined together. For example, laser welding can allow for joints between pieces of sheet metal having different thicknesses, for joints of overlapping pieces of sheet metal, or joints between two planar pieces of sheet metal that are angled relatively to each other, including two pieces of planar sheet metal that are normal or substantially normal with respect to one another. For example, as discussed above, the example front weld joints 140A, 140B join two pieces that are normal or substantially normal relative to one another, that is the front wall piece 72 and one of the frame pieces 78, 80, 82, 84, wherein the edge of the frame piece 78, 80, 82, 84 is joined to the front wall piece 72 on a side of the front wall piece 72 that is opposite the side where the weld joint 140A, 140B is formed. Specifically, as best seen in FIG. 10, the edge 148 of the top wall piece 78 is joined to the rear surface 154 of the front wall piece 72 while the weld joint 140A is formed on the opposing front surface 144 where the joint seam 142A forms. The side joints 140C, 140D are also joining an edge of a frame piece 78, 80, 82, 84, but instead the weld joint 140C, 140D is formed on a surface that is angled relative to the edge being joined, and the stem 146C, 146D of the weld joint 140C, 140D also runs along the edge being joined to the front wall piece 72. The corner weld joint 140E not only includes multiple sections, e.g., the two angled sections of the weld joint 140E, but it also joins three separate pieces together (e.g., front wall piece 72, the top corner piece 101, and the side corner piece 103), where two of the pieces are overlapping and are aligned in the same direction, and the third piece (the front wall piece 72) is angled relative to the other two pieces.

In an example, the chassis 50 can include other structures in addition to the weld joints 140 that assist in coupling and/or aligning components that are to be coupled together to form the chassis 50. For example, a first sheet metal piece can include one or more tabs that can each fit into a corresponding slot in a second sheet metal piece. In the embodiment shown in FIG. 9, the front wall piece 72 includes a plurality of slots 158 that can each receive a corresponding tab 160 of one of the frame pieces 78, 80, 82, 84. For example, the top wall piece 78 includes a plurality of tabs 160A that each extend forward into a corresponding one of the slots 158 along the top edge of the front wall piece 72. Similarly, the side wall piece 82 can include a similar set of tabs 160B that each extend forward into a corresponding one of the slots 158 along the side edge of the front wall piece 72, which is shown better in the cross-sectional view of FIG. 12.

Figure 13:
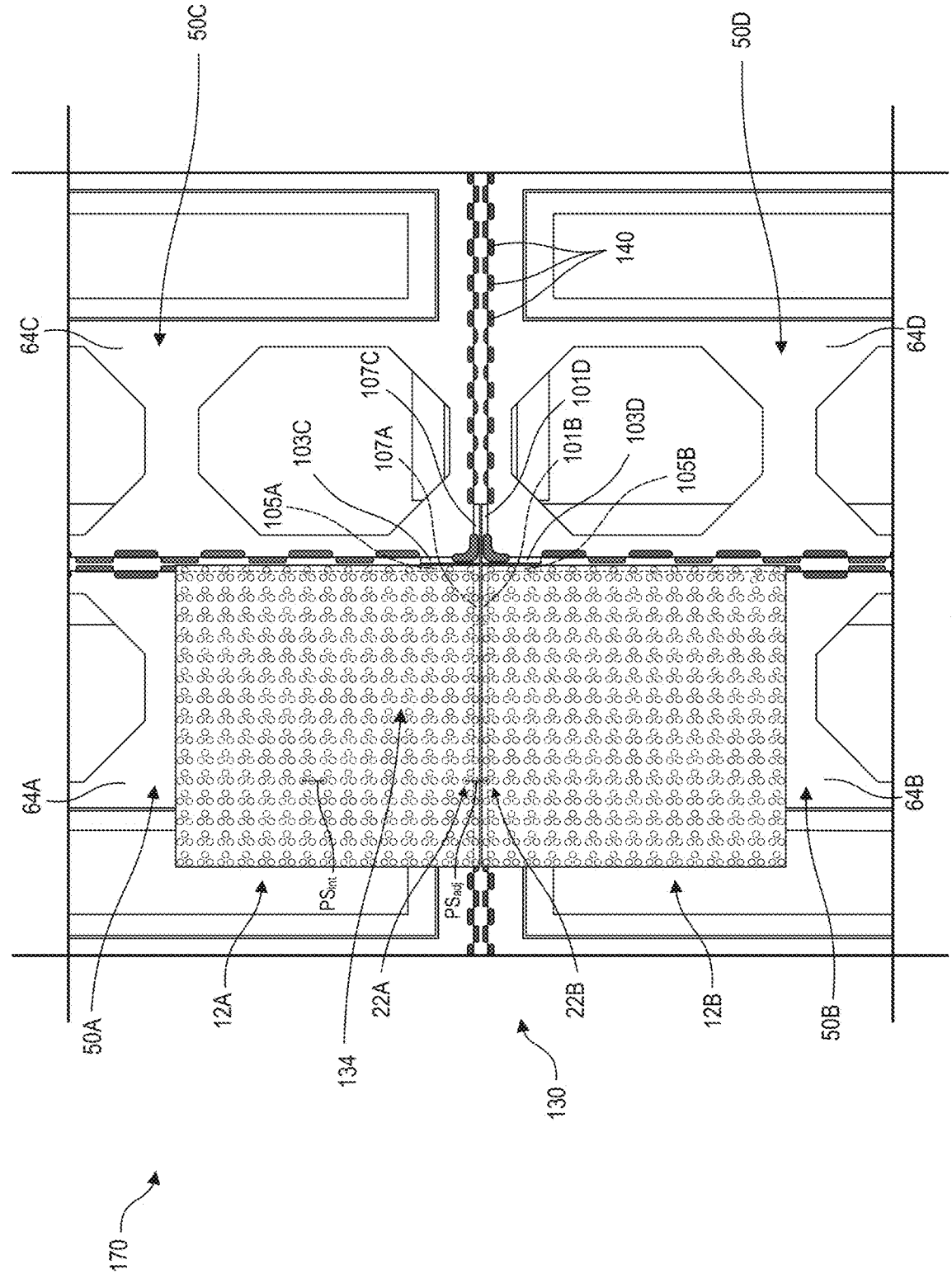
FIG. 13 is a front view of portions of four of the example support chassis of FIGS. 4-9 within an example display with a plurality of display modules mounted to the front faces of the support chassis.

In an example, the chassis 50 of the present description is designed such that the spacing between pixels coupled to adjacent chassis 50 is maintained, e.g., so that pixels at the edge of a first chassis 50 will be spaced from pixels at the edge of a second chassis 50 that is adjacent to the first chassis 50 by the same amount as the internal pixel spacing $PS_{int}$ between adjacent pixels on the same display module 12. FIG. 13 shows a portion of an example display 170 that illustrates this consistent pixel spacing. The example display 170 is formed from a plurality of display modules 12 that cooperatively form an overall display surface 134. An overall support system 130 collectively supports the plurality of display modules 12, wherein the overall support system 130 includes a plurality of chassis 50 abutted against one another in order to form a front mounting surface. FIG. 13 shows a close-up front view of a point within the display 170 where four of the chassis 50A, 50B, 50C, and 50D that make up the overall support system 130 meet (e.g., at a bottom-right corner of a first chassis 50A, a top-right corner of a second chassis 50B, a bottom-left corner of a third chassis 50C, and a top-left corner of a fourth chassis 50D as seen in the view of FIG. 13). The front mounting faces 64A, 64B, 64C, and 64D of the chassis 50A, 50B, 50C, 50D collectively form the front mounting surface of the support system 130.

FIG. 13 also shows one display module 12A mounted to the first chassis 50A and one display module 12B mounted to the second chassis 50B, wherein each of these display modules 12A, 12B are mounted right at the corner of its corresponding chassis 50A, 50B. As can be seen in FIG. 13, when the first chassis 50A is abutted against the second chassis 50B, the bottom surfaces of the bottom corner pieces 107A of the first chassis 50A will be abutted against the top surfaces of the top corner pieces 101B of the second chassis 50B. A pixel 22A at the edge of the first display module 12A mounted to the first chassis 50A is adjacent to a corresponding pixel 22B at the edge of the second display module 12B mounted to the second chassis 50B. The use of the sheet metal components to form the chassis 50A, 50B to form planar or substantially planar abutting surfaces and the use of the low-profile laser weld joint 140 allows the adjacent chassis 50A and 50B to be abutted together in a close enough relationship that a pixel spacing $PS_{adj}$ between the adjacent pixels 22A, 22B mounted to the adjacent chassis 50A, 50B can be as small as 4 mm or less, such as 3 mm or less, for example 2.5 mm or less, such as 2 mm or less, for example 1.5 mm or less, and in some examples as small as 1 mm or less.

In an example, the chassis 50A, 50B described herein are configured so that when the first chassis 50A is abutted against the second chassis 50B, the pixel spacing $PS_{adj}$ between the corresponding adjacent pixels 22A, 22B mounted to the corresponding adjacent chassis 50A, 50B is the same or substantially the same as the internal pixel spacing $PS_{int}$ for each of the individual display modules 12A, 12B that make up the display 170. The equal or substantially equal internal pixel spacing $PS_{int}$ and corresponding adjacent pixel spacing $PS_{adj}$ can ensure that the content being displayed on the display 170 will appear uniform with no seams. In other words, the display 170 will appear, to a viewer of the content on the display 170, to be a single large display module rather than a plurality of much smaller individual display modules 12.

A similar abutting relationship can exist between the first chassis 50A and the third chassis 50C, e.g., with the outside surfaces of the right side corner pieces 105A of the first chassis 50 being abutted against the corresponding outside surfaces of the left side corner pieces 103C of the third chassis 50C. A similar close abutting relationship can also exist between the second chassis 50B and the fourth chassis 50D, e.g., with the outside surfaces of the right side corner pieces 105B of the second chassis 50B being abutted against the corresponding outside surfaces of the left side corner pieces 103D of the fourth chassis 50D. Finally, a similar close abutting relationship can exist between the third chassis 50C and the fourth chassis 50D, e.g., with the bottom surfaces of the bottom corner pieces 107C of the third chassis 50C being abutted against the corresponding top surfaces of the top corner pieces 101D of the fourth chassis 50D. Each of these close abutting relationships can be such that the pair of adjacent chassis 50 (e.g., the first and second chassis 50A and 50B, the first and third chassis 50A and 50C, the second and fourth chassis 50B and 50D, and the third and fourth chassis 50C and 50D) will be abutted in a close enough relationship so that an adjacent pixel spacing $PS_{adj}$ between pixels on the outer edge of display modules 12 mounted to one of the pair of adjacent chassis 50 and pixels on the outer edge of display modules 12 mounted to the other of the pair of adjacent chassis 50 will have the same spacing as described above for the pixel spacing $PS_{adj}$ between the adjacent pixels 22A and 22B, e.g., with an adjacent pixel spacing $PS_{adj}$ that is equal or substantially equal to the internal pixel spacing $PS_{int}$ of the individual display modules 12 that make up the display 170.

The present disclosure also describes a method of forming a support chassis 50. In an example, the method results in a chassis 50 that has one or more of the following features, and in a preferred example all of the following features:
 a) a front mounting face 64 that is planar or substantially planar;
 b) one or more first abutting surfaces on the top side of the chassis 50, such as the top surfaces 138 of the top corner pieces 101, that are planar or substantially planar and (if there is more than one top abutting surface) that are in the same plane or substantially in the same plane;
 c) wherein the one or more first abutting surfaces on the top side of the chassis 50 are normal or substantially normal to the front mounting face 64;
 d) one or more second abutting surfaces on a first side of the chassis 50 (e.g., a left side), such as the side surfaces of the left side corner pieces 103, that are planar or substantially planar and that are in the same plane or substantially in the same plane;
 e) wherein the one or more second abutting surfaces on the first side of the chassis 50 (e.g., the left side) are normal or substantially normal to the front mounting face 64;
 f) one or more third abutting surfaces on a second side of the chassis 50 (e.g., a right side), such as the side surfaces of the right side corner pieces 105, that are planar or substantially planar and that are in the same plane or substantially in the same plane;
 g) wherein the one or more third abutting surfaces on the second side of the chassis 50 (e.g., the right side) are normal or substantially normal to the front mounting face 64;
 h) one or more fourth abutting surfaces on the bottom side of the chassis 50, such as the bottom surfaces 136 of the bottom corner pieces 107, that are planar or substantially planar and that are in the same plane or substantially in the same plane; and
 i) wherein the one or more fourth abutting surfaces on the bottom side of the chassis 50 are normal or substantially normal to the front mounting face 64.

The term "abutting surface," as used herein, refers to a surface of the chassis 50 that is intended to be abutted against a corresponding surface of another chassis 50. For example, the bottom surface 136 of one of the bottom corner pieces 107 of a first chassis 50A is intended to be abutted against a corresponding top surface 138 of a corresponding top corner piece 101 of another chassis 50B that will be abutted against the first chassis 50A, so the bottom surface 136 is an abutting surface of the first chassis 50A on the bottom side of the chassis 50A.

Figure 14:
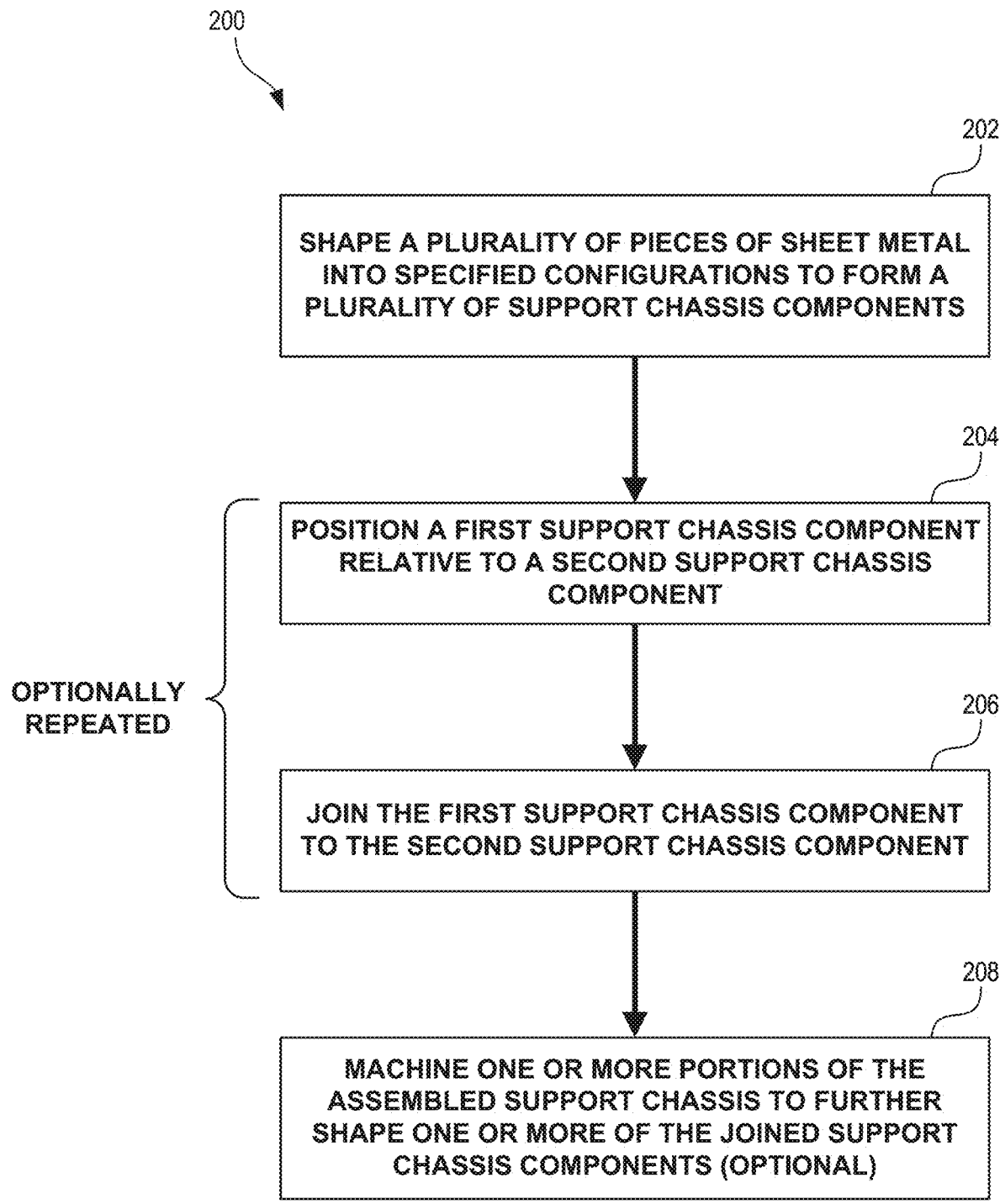
FIG. 14 is a flow diagram of an example method of manufacturing and assembling a support chassis for an electronic display.

FIG. 14 is a flow diagram of an example method 200 of making a support chassis, such as the chassis 50 described above. In an example, the method 200 includes, at step 202, shaping each of a plurality of pieces of sheet metal into specified configurations to form a plurality of specified support chassis components. For example, as described above, the example chassis 50 can be formed from a front wall piece 72 formed from a first piece of sheet metal, a rear wall piece 76 made from a second piece of sheet metal, a top wall piece 78 formed from a third piece of sheet metal, a bottom wall piece 80 formed from a fourth piece of sheet metal, a left wall piece 82 made from a fifth piece of sheet metal, and a right wall piece 84 made from a sixth piece of sheet metal. The example chassis 50 can also include corner pieces 101, 103, 105, 107 as well as the vertical support piece 110 and the horizontal support pieces 124 that are each made from a separate piece of sheet metal. In an example, shaping each of the pieces of sheet metal (step 202) includes cutting a piece of sheet metal to a specified outer shape, such as with a punch press or a laser cutting device. In an example, shaping each of the pieces of sheet metal (step 202) can include bending one or more portions of one or more of the separate pieces, such as with a press brake or even with hand bending of the piece of sheet metal.

As used herein, the term "support chassis component" (or its equivalent "chassis component") refers to a sub-structure of the completed chassis 50, and in particular to a sub-structure that is formed from a single piece of sheet metal that has been shaped into the specified configuration via step 202. Examples of "chassis components" for the example chassis 50 described above with respect to FIGS. 4-12 include, but are not necessarily limited to: the front wall piece 72; the rear wall piece 76, the pieces that make up the frame pieces 78, 80, 82, 84 (e.g., the top wall piece 78, the bottom wall piece 80, the left wall piece 82, and the right wall piece 84); the top corner pieces 101; the left side corner pieces 103; the right side corner pieces 105; the bottom corner pieces 107; the vertical support piece 110; the horizontal support pieces 124; and the cover 118. Those having skill in the art will appreciate that these specific examples of "chassis components" are non-limiting examples that are designed for the specific version of the chassis 50 shown and described above. Those having skill in the art will further appreciate that other configurations of the "chassis components" in step 202 can be envisioned without varying from the scope of the present invention.

In an example, the step of shaping any particular chassis component can include not only cutting or punching the outline shape of the chassis component and bending the chassis component but can also include forming one or more openings in the chassis component. For example, for the example front wall piece 72 described above, step 202 can include forming the one or more mounting openings 66 for the display modules, the support piece opening 74, or one or more fastener openings 70 for coupling a display module 12 to the front wall piece 72. Similarly, for each of the frame pieces 78, 80, 82, 84 and the vertical support piece 110, step 202 can include forming one or more ventilation openings 90, 92, 98, or 100.

After step 202, the example method 200 can also include, at step 204, positioning a first of the chassis components relative to a second of the chassis components so that the relative positioning of the first and second chassis components is the same or substantially the same as a specified relative positioning for the first and second chassis components in the final support chassis. As used herein with respect to step 204 and step 206 (described below), the terms "first support chassis component" (or the equivalent "first chassis component") and "second support chassis component" (or the equivalent "second chassis component") refer to a corresponding pair of the chassis components that were shaped in step 202, which are specified to be adjacent to each other in the specified design of the final chassis such that the first chassis component and the second chassis component are to be joined together by one or more coupling means (as described below with respect to step 206). In other words, the "first chassis component" and the "second chassis component" in any particular iteration of step 204 are components that are to be directly joined together, and not just any two chassis components of the final design. For example, the front wall piece 72 and the rear wall piece 76 in the example chassis 50 described above are not adjacent to one another, but rather or located on opposing sides of the frame formed by the frame pieces 78, 80, 82, 84, and as such it would not make sense to perform a step of positioning the front wall piece 72 relative to the rear wall piece 76 by themselves, because there would be no potential joint to be formed, at least not without one or more of the frame pieces 78, 80, 82, 84 also being positioned in the same iteration of step 204.

The step of positioning the chassis components (step 204) is a step of preparing the first and second chassis components for coupling together, and in particular preparing the first and second chassis components for laser welding the chassis components together. In an example, positioning the first and second chassis components relative to one another can include placing the first and second chassis components in one or more fixtures (also referred to as "fixturing the first and second chassis components in one or more fixtures," or simply "fixturing the first and second chassis components"). The one or more fixtures can be configured to clamp or otherwise hold the first chassis component and the second chassis component in a fixed relative position that is the same or substantially the same as the specified final relative positioning of the first chassis component relative to the second chassis component. In an example, the one or more fixtures can include a jig or another similar type structure that clamps or holds the first and second chassis components in the specified relative position. In some examples, the one or more fixtures can include one or more structures or devices that are configured to guide a joining tool, such as a laser welder, relative to the first and second chassis components in order to join the first and second chassis components together (as described below with respect to step 206). In an example, the fixture can be part of an overall laser-welding system for joining sheet metal pieces together, such as the those sold under the TRULASER trade name by Trumpf Werkzeugmaschienen GmbH+Co. KG, Ditzingen, Germany. In an example, the one or more fixtures comprise a modular clamping system of a TRULASER laser welding system, sold by Trumpf Werkzeugmaschienen GmbH+Co. KG, Ditzingen, Germany.

The example method can include, after positioning the first chassis component relative to the second chassis component (step 204), at step 206, joining the first chassis component to the second chassis component. In particular, step 206 includes laser welding the first chassis component to the second chassis component, e.g., by forming one or more laser weld joints between the first chassis component and the second chassis component. In an example, the joining of step 206 can include laser welding for all of the corresponding pairs of first and second chassis components (e.g., for each pair of chassis components that are adjacent to each other along at least one edge). The joining of step 206 need not be 100% by laser welding, however. Rather, laser welding can be used only for locations on the final chassis that will be particularly close to another structure, such as an adjacent chassis or a display module, such as any structure that will be within 4 mm of the chassis components being joined, for example within 3 mm, such as within 2.5 mm, for example within 2 mm, such as within 1.5 mm, for example within 1 mm.

In the example method 200, steps 204 and 206 will typically be performed as a pair of sub-steps that are both performed before performing another iteration of step 204 and then step 206. For example, the method can include a first iteration of step 204 wherein a first chassis component is positioned relative to a second chassis component, and then the first chassis component is joined with the second chassis component in step 206. Then, the method can include a second iteration of step 204, wherein a third chassis component is positioned relative to a fourth chassis component, followed by a second iteration of step 206, wherein the third chassis component is joined with the fourth chassis component. Alternatively, the second iteration of step 204 can include positioning the now joined first and second chassis components relative to a third chassis component, followed by an alternative second iteration of step 206, wherein the third chassis component is joined to the first chassis component or to the second chassis component, or both.

A corresponding pair of step 204 and step 206 can be repeated for each combination of two chassis components that are to be joined together in the final chassis. For example, with respect to the example chassis 50 described above, in a first iteration, the "first chassis component" can be the front wall piece 72 and the "second chassis component" can be the top wall piece 78, such that step 204 comprises positioning the front wall piece 72 relative to the top wall piece 78, and step 206 can include joining the front wall piece 72 to the top wall piece 78, such as by forming one or more laser weld joints 140 along the common edge of the front wall piece 72 and the top wall piece 78, such as the example front weld joints 140A and the top weld joints 140C (described above).

After this first iteration, a second iteration of step 204 can be performed, wherein in the second iteration, the "first chassis component" can be the front wall piece 72 (or the joined combination of the front wall piece 72 and the top wall piece 78 that were positioned in the first iteration) and the "second chassis component" can be the left wall piece 82, followed by a second iteration of step 206 where the front wall piece 72 is joined to the left wall piece 82, such as by forming one or more laser weld joints 140 along the common edge of the front wall piece 72 and the left wall piece 82, for example by forming the plurality of front weld joints 140B and side weld joints 140D. After this second iteration, a third iteration of steps 204 and 206 can be performed, wherein in the third iteration, the "first chassis component" can be the front wall piece 72 (or the joined combination of the front wall piece 72, the top wall piece 78, and the left wall piece 82 joined in in the second iteration) and the "second chassis component" can be the right wall piece 84. Corresponding pairs of step 204 and step 206 can be repeated until all of the adjacent chassis components are joined together, such as with a corresponding set of one or more laser weld joints, resulting in the formation of an assembled chassis.

In an example, rather than "repeating" a corresponding pair of step 204 and step 206 for each combination of two or more chassis components, the method 200 can include positioning all or a larger subset of the chassis components relative to one other, such as by putting all or the larger subset of the chassis components into a fixture (step 204) that can hold the group of chassis components in their proper relative positions, and then joining the corresponding pairs of chassis components, such as by forming one or more laser weld joints between each corresponding pair of chassis components essentially in one laser welding operation.

In one example, each iteration of step 204 and step 206 can include positioning only a first chassis component relative to a second chassis component and then joining the first and second chassis components together. In another example, one or more of the corresponding pairs of step 204 and step 206 can include positioning more than just two chassis components relative to one another and then joining the combination of more than two chassis components. In other words, step 204 can include positioning a first of the chassis components, a second of the chassis components, and a third of the chassis components so that the relative positioning of the first, second, and third chassis components is the same or substantially the same as a specified relative positioning for the first, second, and third chassis components in the final chassis. Then, the corresponding step 206 can include joining the first chassis component, the second chassis component, and the third chassis component together, e.g., by forming one or more laser weld joints that couple the first chassis component to one or both of the second and third chassis components, or that couples the second chassis component to one or both of the first and third chassis components, or that couples the third chassis component to one or both of the first and second chassis components, or that couples all three of the first, second, and third chassis components together. Step 204 can further include positioning any further number of chassis components and step 206 can include joining any further number of chassis components as is practical for a particular joint or other connection that is being formed. For example, step 204 can include positioning a first chassis component, a second chassis component, a third chassis component, and a fourth chassis component relative to one another as specified and the corresponding step 206 can include joining one or more combinations of the first, second, third, and fourth chassis components together. In an example corresponding to the example chassis 50 described above, the first chassis component can be the top wall piece 78, the second chassis component can be the left wall piece 82, the third chassis component can be a top corner piece 101, and the fourth chassis component can be a left side corner piece 103. In such an example, step 204 can include positioning the top wall piece 78, the left wall piece 82, the top corner piece 101, and the left side corner piece 103 in relative position with respect to each other, such as in the relative positions shown in FIGS. 7 and 9. Then, the corresponding step 206 can include joining the top wall piece 78, the left wall piece 82, the top corner piece 101, and the left side corner piece 103 together, such as by forming the corner laser weld joint 140E. Similar positioning and joining of multiple chassis components can be performed for the top wall piece 78, the right wall piece 84, another top corner piece 101, and a right side corner piece 105; for the left side corner piece 103, the bottom wall piece 80, another left side corner piece 103, and a bottom corner piece 107; and for the bottom wall piece 80, the right wall piece 84, another right side corner piece 105, and another bottom corner piece 107.

After the joining of step 206, the method 200 can optionally include, at step 208, machining one or more portions of the assembled chassis to further shape one or more chassis components, in order to provide the final chassis. In an example, the machining of step 208 can include forming one or more alignment holes for the display modules that are to be mounted to the final chassis. The alignment holes can ensure that when the display modules are mounted to the chassis, they will be aligned in the same plane or substantially in the same plane so that an overall display formed from the display modules will be uniform. In an example, forming the alignment holes after the joining of step 206, e.g., after the assembled chassis has been formed, can ensure that the orientation of the alignment holes will be independent of the positioning and joining of steps 204 and 206, which can account for variance in steps 204 and 206 that might otherwise cause pre-formed alignment holes to become slightly misaligned.

In another example, the machining to further shape one or more chassis components of step 208 can include machining one or more of: an edge of one or more of the chassis components; or one or more laser weld joints that were formed in step 206. In an example, this type of machining can be performed if an edge of one or more of the chassis components or the protruding seam of one or more of a laser weld joints might otherwise interfere with a specified alignment of the final chassis with another adjacent chassis or with one or more display modules to be mounted to the final chassis. As noted above, laser welding can be configured so that the weld seams are relative low profile and the laser welding process can often be designed so that the laser weld seams will not interfere with a specified abutment of the final chassis with another structure, such as an adjacent chassis or a display module. However, it is still possible through manufacturing variation for one or more structures of the assembled chassis to unexpectedly interfere with the specified abutting relationship. In such a situation, it may be necessary for the method 200 to include machining the structures that interfere with the specified abutting relationship. However, as is also described above, the weld seams of laser weld joints generally have a much smaller profile, especially compared to conventional arc welding. Therefore, even if machining of the weld seams is determined to be necessary, the amount of machining will be less than would be required for conventional welding, and thus the machining of step 208 would be less expensive. Similarly, any machining that is necessary to reduce weld seams or other structures, it is expected to require substantially less machining, and thus substantially less machining cost, compared to machining that is typically required for a die cast support chassis. In an example, the method 200 does not include any machining of the support chassis other than machining to form mounting structures such as alignment openings.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic display comprising:
    a support system comprising a plurality of support chassis, each support chassis comprising:
        a plurality of chassis components each formed from one or more pieces of sheet metal,
        wherein the plurality of chassis components are welded together with a plurality of laser weld joints to form the support chassis having a front wall with a planar or substantially planar front mounting face, and a plurality of planar or substantially planar side walls; and
        wherein the planar or substantially planar front mounting faces of the plurality of support chassis are aligned to collectively form a display mounting surface; and
    a plurality of display modules mounted to the display mounting surface, wherein each display module comprises an array of light-emitting element pixels, wherein the plurality of display modules collectively form a display surface,
    wherein the array of pixels of each of the plurality of the display modules has an internal pixel spacing, wherein a spacing between a first pixel at a first edge of a first of the plurality of the display modules mounted to a first support chassis and a second pixel at a second edge of a second of the plurality of the display modules mounted to a second support chassis is the same or substantially the same as the internal pixel spacing, wherein the first support chassis is abutted against the second support chassis, the first edge of the first of the plurality of the display modules is adjacent to the second edge of the second of the plurality of the display modules, and the first pixel is adjacent to the second pixel.

2. The electronic display of claim 1, wherein each of the support chassis further comprises one or more internal support structures, wherein each internal support structure is formed from one or more pieces of sheet metal.

3. The electronic display of claim 1, wherein the front wall of each of the plurality of support chassis is formed from one or more front wall pieces, wherein each front wall piece is formed from a single piece of sheet metal.

4. The electronic display of claim 1, wherein each of the plurality of side walls of each of the plurality of support chassis is formed from one or more side wall pieces each formed from a single piece of sheet metal.

5. The electronic display of claim 4, wherein each of the plurality of support chassis each comprise a plurality of corner pieces each configured to adjoin an intersection between two adjacent side walls.

6. The electronic display of claim 5, wherein one or more of the corner pieces comprise a planar or substantially planar abutting surface that is normal or substantially normal to the planar or substantially planar front mounting face, wherein a first abutting surface on a first of the plurality of support chassis is abutted against a corresponding second abutting surface of a second of the plurality of support chassis.

7. The electronic display of claim 1, wherein each of the plurality of support chassis further comprises one or more planar or substantially planar abutting surfaces located on one or more of the plurality of side walls, wherein a first abutting surface on a first of the plurality of support chassis is abutted against a corresponding second abutting surface of a second of the plurality of support chassis, wherein each planar or substantially planar abutting surface is normal or substantially normal to the planar or substantially planar front mounting face.

8. The electronic display of claim 7, wherein a third abutting surface on the first of the plurality of support chassis is abutted against a corresponding fourth abutting surface of a third of the plurality of support chassis.

9. The electronic display of claim 8, wherein a fifth abutting surface on the first of the plurality of support chassis is abutted against a corresponding sixth abutting surface of a fourth of the plurality of support chassis.

10. The electronic display of claim 8, wherein a seventh abutting surface on the second of the plurality of support chassis is abutted against a corresponding eighth abutting surface of a fifth of the pluralist of support chassis.

11. The electronic display of claim 1, wherein the front wall of each of the plurality of support chassis is formed from a front wall piece made from a single piece of sheet metal and each side wall of each of the plurality of support chassis is formed from one or more side wall pieces each formed from a single piece of sheet metal;
   wherein the front wall piece of each of the plurality of support chassis is joined to each of the one or more side wall pieces by a plurality of front laser weld joints around a periphery of the front wall piece.

12. The electronic display of claim 1, wherein the internal pixel spacing and the spacing between the first pixel and the second pixel is 4 millimeters or less.

13. The electronic display of claim 1, wherein at least one of the plurality of chassis components for each support chassis comprises a piece of sheet metal formed into a shaped chassis component.

14. The electronic display of claim 13, wherein forming the shaped chassis component comprises one or both of cutting the piece of sheet metal or bending the piece of sheet metal to form the shaped chassis component.

\* \* \* \* \*